United States Patent
Bertin et al.

(10) Patent No.: US 7,071,023 B2
(45) Date of Patent: *Jul. 4, 2006

(54) NANOTUBE DEVICE STRUCTURE AND METHODS OF FABRICATION

(75) Inventors: Claude L. Bertin, South Burlington, VT (US); Thomas Rueckes, Boston, MA (US); Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/918,181

(22) Filed: Aug. 13, 2004

(65) Prior Publication Data

US 2005/0037547 A1    Feb. 17, 2005

Related U.S. Application Data

(60) Provisional application No. 60/580,879, filed on Jun. 18, 2004, provisional application No. 60/494,889, filed on Aug. 13, 2003.

(51) Int. Cl.
H01L 51/40    (2006.01)
H01L 21/335    (2006.01)
H03H 9/00    (2006.01)

(52) U.S. Cl. .................. 438/99; 438/128; 438/142; 257/211; 257/E27.004; 29/622; 333/133; 333/187; 977/DIG. 1

(58) Field of Classification Search ............. 438/99, 438/52, 128, 142; 257/211, E27.004, 416; 29/622; 333/133, 186, 187; 977/DIG. 1
See application file for complete search history.

(56) References Cited

U.S. PATENT DOCUMENTS

| | | | |
|---|---|---|---|
| 4,979,149 A | 12/1990 | Popovic et al. | |
| 6,128,214 A | 10/2000 | Kuekes et al. | |
| 6,159,620 A | 12/2000 | Heath et al. | |
| 6,183,714 B1 | 2/2001 | Smalley et al. | |
| 6,198,655 B1 | 3/2001 | Heath et al. | |
| 6,221,330 B1 | 4/2001 | Moy et al. | |
| 6,232,706 B1 | 5/2001 | Dai et al. | |
| 6,376,787 B1 * | 4/2002 | Martin et al. | 200/181 |
| 6,426,687 B1 * | 7/2002 | Osborn | 333/262 |
| 6,445,006 B1 * | 9/2002 | Brandes et al. | 257/76 |
| 6,518,156 B1 | 2/2003 | Chen | |
| 6,548,841 B1 | 4/2003 | Frazier et al. | |
| 6,559,468 B1 | 5/2003 | Kuekes et al. | |
| 6,574,130 B1 | 6/2003 | Segal et al. | |
| 6,643,165 B1 | 11/2003 | Segal et al. | |
| 6,673,424 B1 | 1/2004 | Lindsay | |
| 6,706,402 B1 | 3/2004 | Rueckes et al. | |
| 6,741,334 B1 * | 5/2004 | Asano et al. | 355/77 |
| 6,750,471 B1 | 6/2004 | Bethune et al. | |
| 6,759,693 B1 | 7/2004 | Vogeli et al. | |
| 6,774,052 B1 | 8/2004 | Vogeli et al. | |
| 6,781,166 B1 | 8/2004 | Lieber et al. | |
| 6,784,028 B1 | 8/2004 | Rueckes et al. | |
| 6,803,840 B1 | 10/2004 | Hunt et al. | |
| 6,809,465 B1 | 10/2004 | Jin | |
| 6,835,591 B1 | 12/2004 | Rueckes et al. | |
| 6,884,734 B1 * | 4/2005 | Buehrer et al. | 438/723 |
| 6,946,410 B1 * | 9/2005 | French et al. | 438/800 |
| 2002/0130311 A1 | 9/2002 | Lieber et al. | |
| 2002/0130353 A1 | 9/2002 | Lieber et al. | |
| 2002/0172963 A1 | 11/2002 | Kelley et al. | |
| 2002/0175390 A1 | 11/2002 | Goldstein et al. | |
| 2002/0179434 A1 | 12/2002 | Dai et al. | |
| 2003/0021966 A1 | 1/2003 | Segal et al. | |
| 2003/0124325 A1 | 7/2003 | Rueckes et al. | |
| 2003/0165074 A1 | 9/2003 | Segal et al. | |
| 2003/0234407 A1 | 12/2003 | Vogeli et al. | |
| 2003/0236000 A1 | 12/2003 | Vogeli et al. | |
| 2004/0085805 A1 | 5/2004 | Segal et al. | |
| 2004/0099438 A1 * | 5/2004 | Arthur et al. | 174/257 |
| 2004/0159833 A1 | 8/2004 | Rueckes et al. | |
| 2004/0164289 A1 | 8/2004 | Rueckes et al. | |
| 2004/0175856 A1 | 9/2004 | Jaiprakash et al. | |
| 2004/0181630 A1 | 9/2004 | Jaiprakash et al. | |
| 2004/0191978 A1 | 9/2004 | Rueckes et al. | |

| | | | |
|---|---|---|---|
| 2004/0198030 A1 | 10/2004 | Buehrer et al. | |
| 2004/0214366 A1 | 10/2004 | Segal et al. | |
| 2004/0214367 A1 | 10/2004 | Segal et al. | |
| 2005/0007002 A1* | 1/2005 | Golovchenko et al. | 313/311 |
| 2005/0035344 A1 | 2/2005 | Bertin et al. | |
| 2005/0035367 A1 | 2/2005 | Bertin et al. | |
| 2005/0035786 A1 | 2/2005 | Bertin et al. | |
| 2005/0035787 A1 | 2/2005 | Bertin et al. | |
| 2005/0040874 A1* | 2/2005 | Allison et al. | 327/231 |
| 2005/0041466 A1* | 2/2005 | Rueckes et al. | 365/177 |

FOREIGN PATENT DOCUMENTS

| | | |
|---|---|---|
| WO | WO 01/03208 | 1/2001 |
| WO | WO 01/44797 A1 | 6/2001 |
| WO | WO 03/091486 A1 | 11/2003 |
| WO | WO 04/065655 A1 | 8/2004 |
| WO | WO 04/065657 A1 | 8/2004 |
| WO | WO 04/065671 A1 | 8/2004 |

OTHER PUBLICATIONS

Ajayan, P.M., et al., "Nanometre-size tubes of carbon," Rep. Prog. Phys., 1997, vol. 60, pp. 1025-1062.
Ami, S. et al., "Logic gates and memory cells based on single $C_{60}$ electromechanical transistors," Nanotechnology, 2001, vol. 12, pp. 44-52.
Avouris, P., "Carbon nanotube electronics," Carbon, 2002, vol. 14, pp. 1891-1896.
Casavant, M.J. et al., "Neat macroscopic membranes of aligned carbon nanotubes," Journal of Appl. Phys., 2003, vol. 93(4), pp. 2153-2156.
Choi, W.-B. et al., "Carbon-nanotube-based nonvolatile memory with oxide-nitride-film and nanoscale channel," Appl. Phys. Lett., 2003, vol. 82(2), pp. 275-277.
Cui, J.B. et al., "Carbon Nanotube Memory Devices of High Charge Storage Stability," Appl. Phys. Lett., 2002, vol. 81(17), pp. 3260-3262.
Dai, H. et al., "Controlled Chemical Routes to nanotube Architectures, Physics, and Devices," J. Phys. Chem. B, 1999, vol. 103, pp. 111246-11255.
Dehon, A., "Array-Based Architecture for FET-Based, Nanoscale Electronics," IEEE Transactions on Nanotechnology, 2003, vol. 2(1), pp. 23-32.
Dequesnes, M. et al., "Calculation of pull-in voltages for carbon-nanotube-based nanoelectromechanical switches," Nanotechnology, 2002, vol. 13, pp. 120-131.
Dequesnes, M. et al., "Simulation of carbon nanotube-based nanoelectromechanical switches," Computational Nanoscience and Nanotechnology, 2002, pp. 383-386.
Fan, S. et al., "Carbon nanotube arrays on silicon substrates and their possible application," Physica E, 2000, vol. 8, pp. 179-183.
Farajian, A. A. et al., "Electronic transport through bent carbon nanotubes: Nanoelectromechanical sensors and switches," Phys. Rev. B, 2003, vol. 67, pp. 205423-1=205423-6.
Fischer, J.E. et al., "Magnetically aligned single wall carbon nanotube films: Preferred Orientation and Anisotropic t Transport Properties," Journal of Appl. Phys., 2003, vol. 93(4), pp. 2157-2163.
Franklin, N. R. et al., "Integration of suspended carbon nanotube arrays into electronic devices and electromechanical systems," Appl. Phys. Lett., 2002, vol. 81(5), pp. 913-915.
Fuhrer, M.S. et al., "High-Mobility Nanotube Transistor Memory," Nano Letters, 2002, vol. 2(7), pp. 755-759.
Homma, Y. et al., "Growth of Suspended Carbon Nanotubes Networks on 100-nm-scale Silicon Pillars," Appl. Phys. Lett., 2002, vol. 81(12), pp. 2261-2263.

Kinaret, J.M. et al., "A carbon-nanotube-based nanorelay", Appl. Phys. Lett., 2003, vol. 82(8), pp. 1287-1289.
Lee, K.-H. et al., "Control of growth orientation for carbon nanotubes," Appl, Phys. Lett., 2003, vol. 82(3), pp. 448-450.
Radosavljevic, M. et al., "Nonvolatile molecular memory elements based on ambipolar nanotube field effect transistors," Nano Letters, 2002, vol. 2(7), pp. 761-764.
Robinson, L.A.W., "Self-Aligned Electrodes for Suspended Carbon Nanotube Structures," Microelectronic Engineering, 2003, vols. 67-68, pp. 615-622.
Rueckes, T., "Carbon Nanotube-Based Nonvolatile Random Access Memory for Molecular Computing" Science, 2000, vol. 289, pp. 94-97.
Soh, H. T. et al., "Integrated nanotube circuits: Controlled growth and ohmic contacting of single-walled carbon nanotubes," Appl. Phys. Lett., 1999, vol. 75(5), pp. 627-629.
Sreekumar, T.V., et al., "Single-wall Carbon Nanotube Films", Chem. Mater. 2003, vol. 15, pp. 175-178.
Tans, S. et al., "Room-temperature based on a single carbon nanotube," Nature, 1998, vol. 393, pp. 49-52.
Tour, J. M. et al., "NanoCell Electronic Memories," J. Am. Chem Soc., 2003, vol. 125, pp. 13279-13283.
Verissimo-Alves, M. et al., "Electromechanical effects in carbon nanotubes: Ab initio and analytical tight-binding calculations," Phys. Rev. B, 2003, vol. 67, pp. 161401-1-161401-4.
Wolf, S., Silicon Processing for the VLSI era; vol. 2—Process Integration, Lattice Press, Sunset Beach, 1990, 189-191, 260-273.
Zhan, W. et al., "Microelectrochemical Logic Circuits," J. Am. Chem. Soc., 2003, vol. 125, pp. 9934-9935.

* cited by examiner

*Primary Examiner*—Michael Lebentritt
*Assistant Examiner*—Ron Pompey
(74) *Attorney, Agent, or Firm*—Wilmer Cutler Pickering Hale and Dorr LLP

(57) ABSTRACT

Nanotube device structures and methods of fabrication. Under one embodiment, a method of forming a nanotube switching element includes forming a first structure having at least one output electrode, forming a conductive article having at least one nanotube, and forming a second structure having at least one output electrode and positioning said second structure in relation to the first structure and the conductive article such that the output electrode of the first structure is opposite the output electrode of the second structure and such that a portion of the conductive article is positioned therebetween. At least one signal electrode is provided in electrical communication with the conductive article having at least one nanotube, and at least one control electrode is provided in relation to the conductive article such that the conductive electrode may control the conductive article to form a channel between the signal electrode and at least one of the output electrodes. The first and second structures each include a respective second output electrode and wherein the second electrodes are positioned opposite each other with the conductive article positioned therebetween. The control electrode and the second control electrode includes an insulator layer on a surface facing the conductive article.

14 Claims, 25 Drawing Sheets

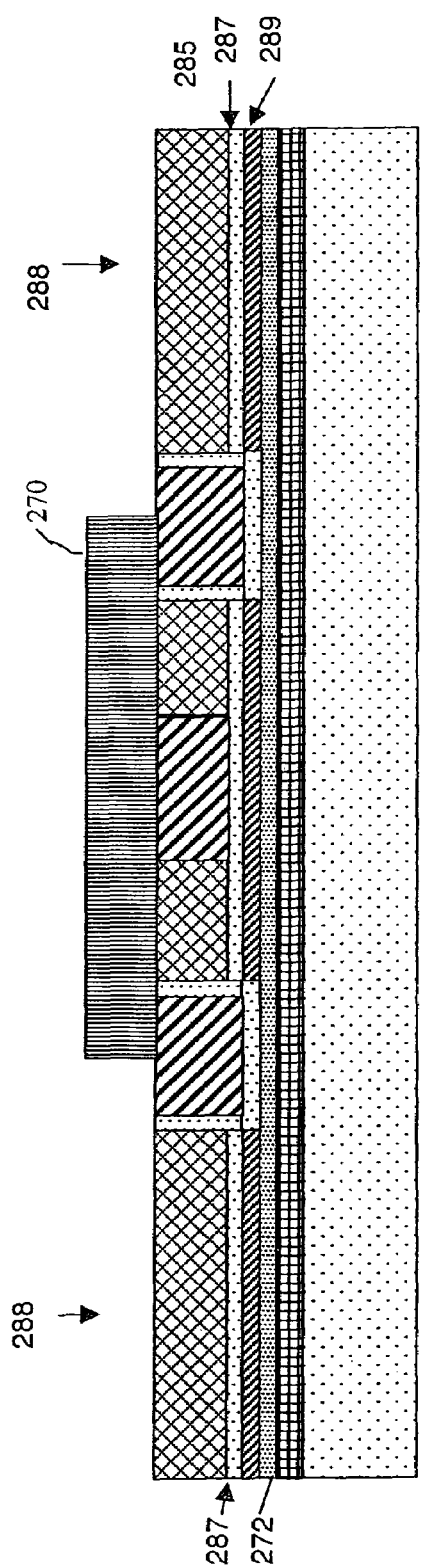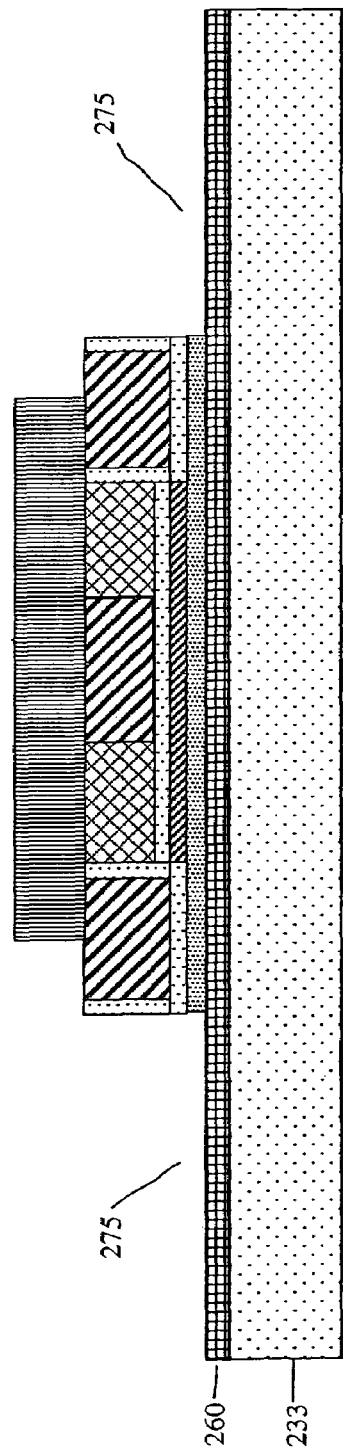

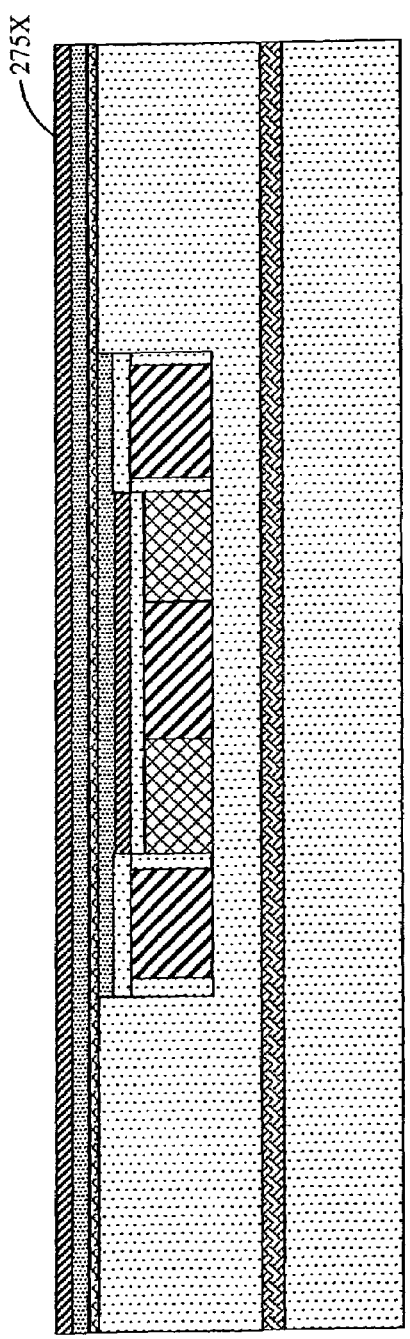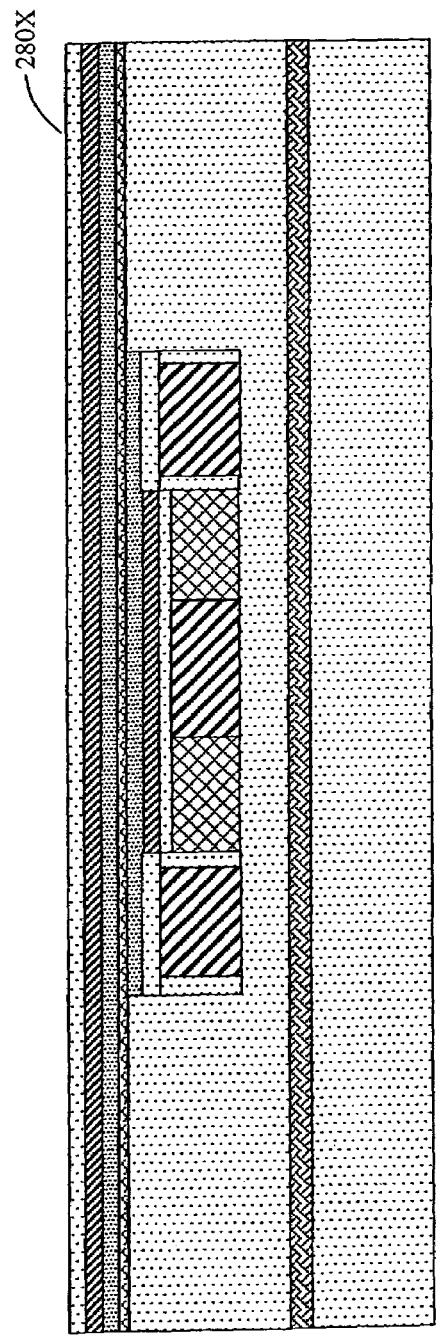
Figure 2W
Figure 2X

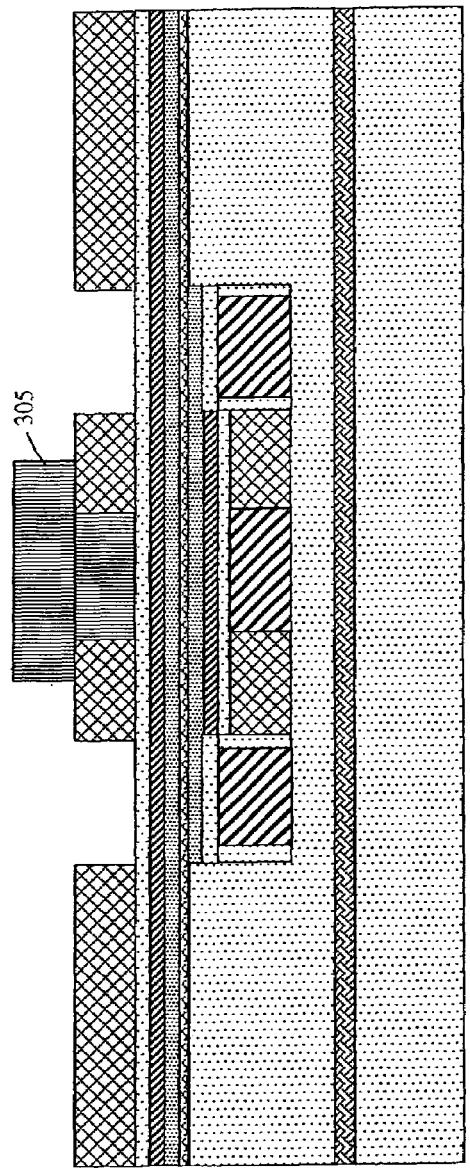
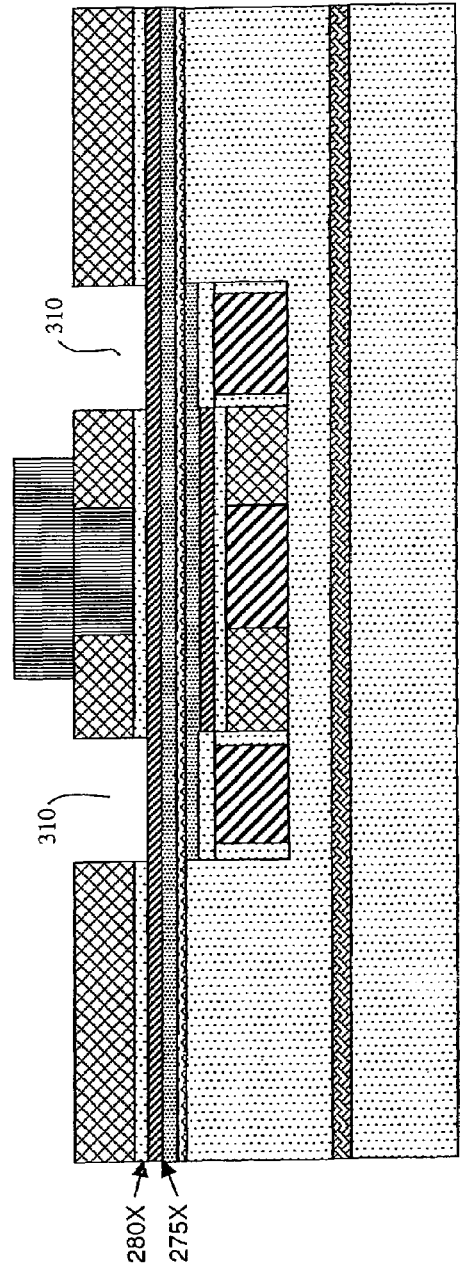
Figure 2AA
Figure 2BB

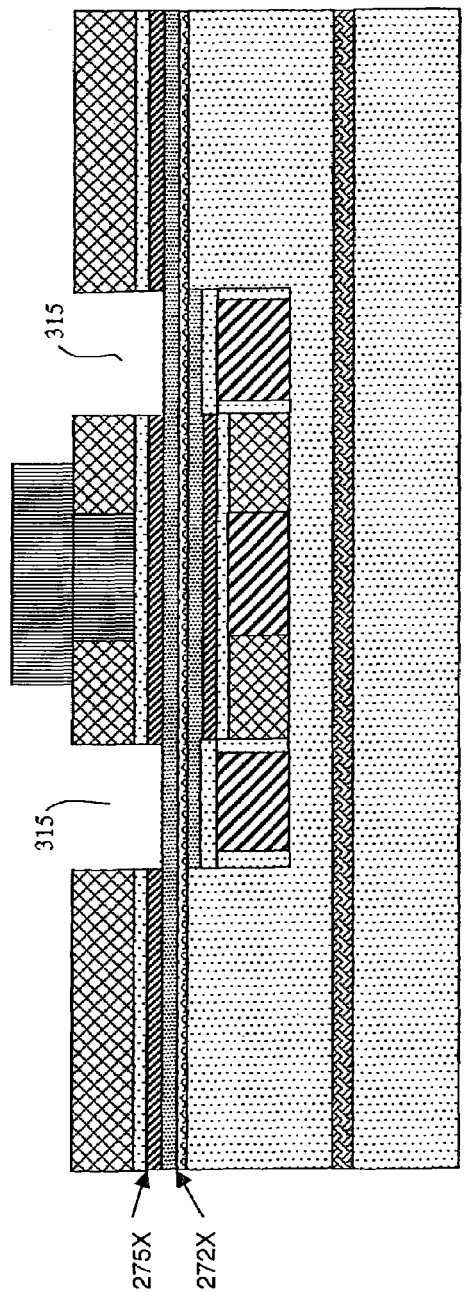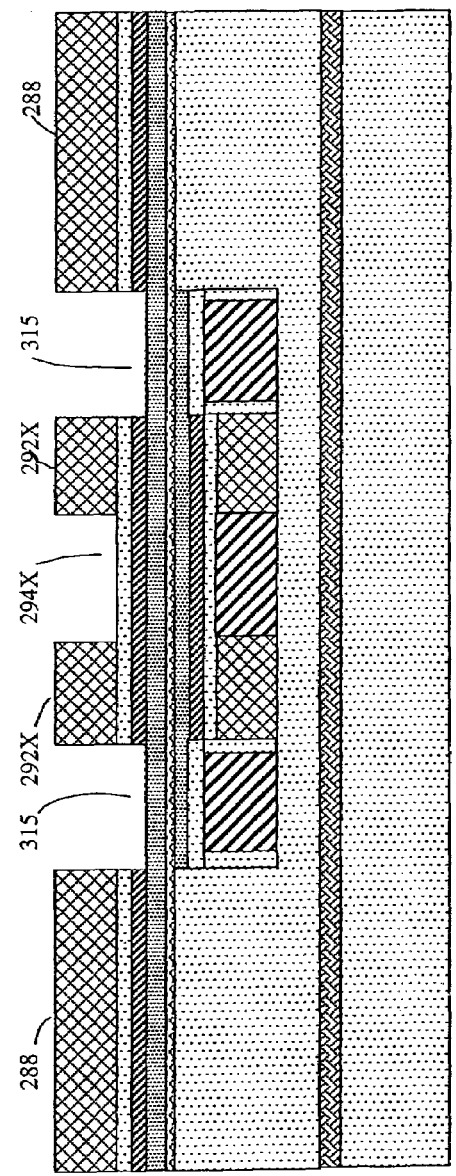

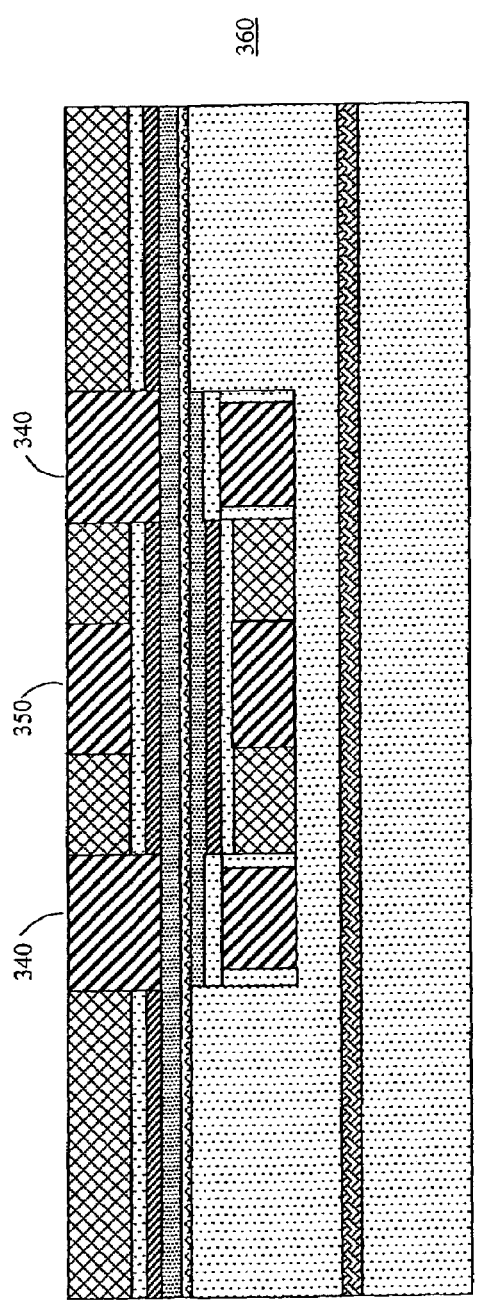
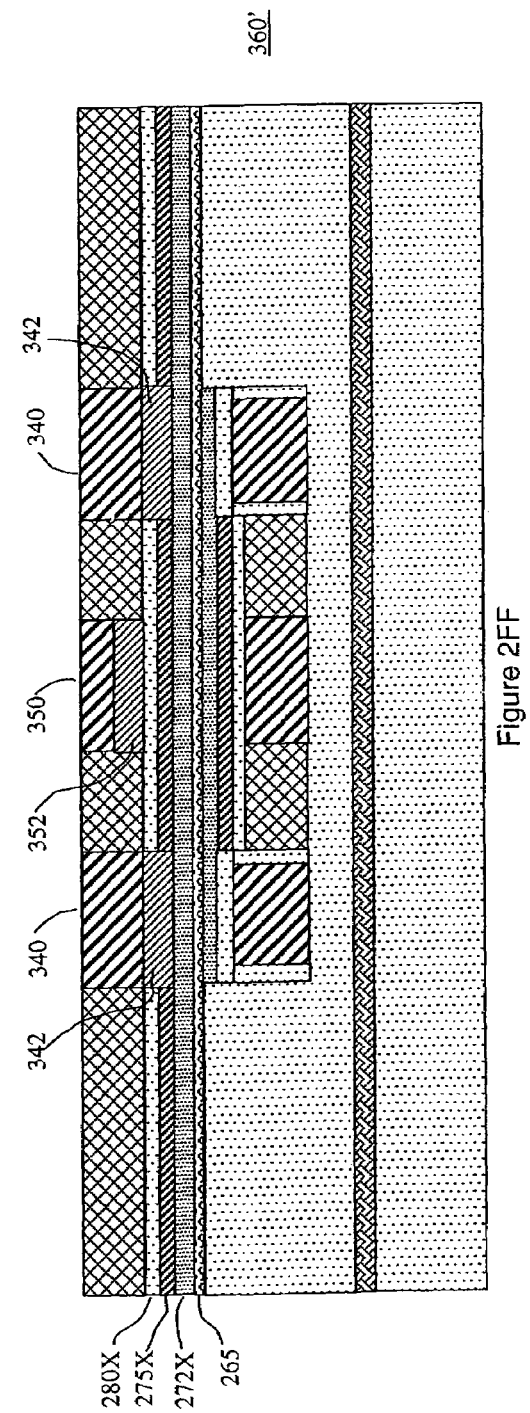
Figure 2EE
Figure 2FF

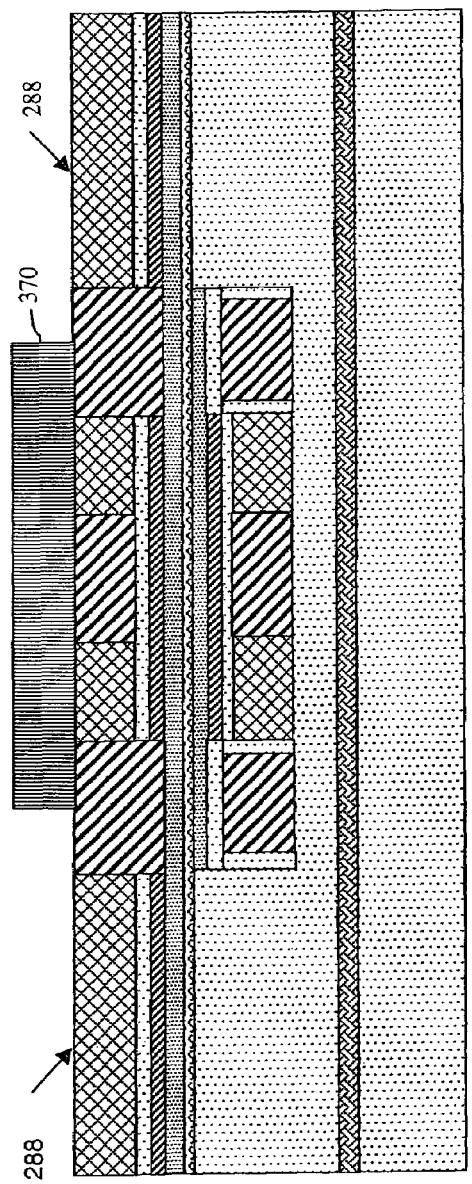
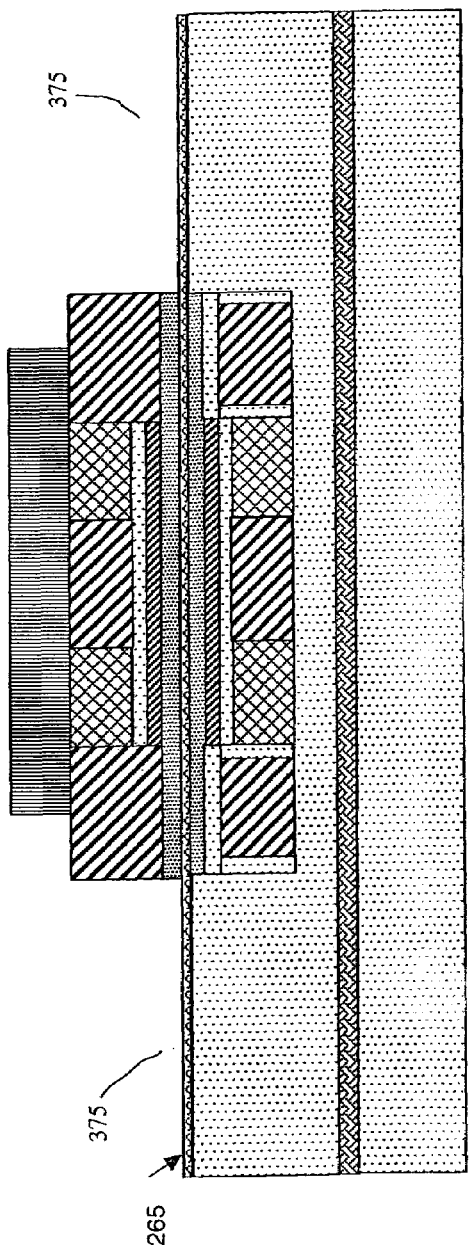
Figure 2GG
Figure 2HH

NANOTUBE DEVICE STRUCTURE AND METHODS OF FABRICATION

CROSS-REFERENCE TO RELATED APPLICATIONS

This application claims priority under 35 U.S.C. § 119(e) to U.S. Provisional Pat. Apl., Ser. No. 60/494,889, filed on Aug. 13, 2003, entitled Nanoelectromechanical Nanotube-Based Logic, which is incorporated herein by reference in its entirety. This application also claims priority under 35 U.S.C. § 119(e) to U.S. Provisional Pat. Apl., Ser. No. 60/580,879, filed on Jun. 18, 2004, entitled Carbon Nanotube (NCT) Device Structure and Methods of Fabrication, which is incorporated herein by reference in its entirety.

This application is related to the following references:

U.S. patent application Ser. No. 10/917,794 filed on date even herewith, entitled Nanotube-Based Switching Elements; [Nan-31]

U.S. patent application Ser. No. 10917,893 filed on date even herewith, entitled Nanotube-Based Switching Elements And Logic Circuits; [Nan-78]

U.S. patent application Ser. No. 10/917,893 filed on date even herewith, entitled Isolation Structure for Deflectable Nanotube Elements; [Nan-79]

U.S. patent application Ser. No. 10/917,932 filed on date even herewith, entitled Circuits Made from Nanotube-Based Switching Elements with Multiple Controls. [Nan-80]

BACKGROUND

1. Technical Field

The present application relates generally to nanotube fabrics and methods of making same and, more specifically to carbon nanotube fabrics and methods of making same for use in logic circuits and arrays.

2. Discussion of Related Art

Digital logic circuits are used in personal computers, portable electronic devices such as personal organizers and calculators, electronic entertainment devices, and in control circuits for appliances, telephone switching systems, automobiles, aircraft and other items of manufacture. Early digital logic was constructed out of discrete switching elements composed of individual bipolar transistors. With the invention of the bipolar integrated circuit, large numbers of individual switching elements could be combined on a single silicon substrate to create complete digital logic circuits such as inverters, NAND gates, NOR gates, flip-flops, adders, etc. However, the density of bipolar digital integrated circuits is limited by their high power consumption and the ability of packaging technology to dissipate the heat produced while the circuits are operating. The availability of metal oxide semiconductor ("MOS") integrated circuits using field effect transistor ("FET") switching elements significantly reduces the power consumption of digital logic and enables the construction of the high density, complex digital circuits used in current technology. The density and operating speed of MOS digital circuits are still limited by the need to dissipate the heat produced when the device is operating.

Digital logic integrated circuits constructed from bipolar or MOS devices do not function correctly under conditions of high heat or extreme environment. Current digital integrated circuits are normally designed to operate at temperatures less than 100 degrees centigrade and few operate at temperatures over 200 degrees centigrade. In conventional integrated circuits, the leakage current of the individual switching elements in the "off" state increases rapidly with temperature. As leakage current increases, the operating temperature of the device rises, the power consumed by the circuit increases, and the difficulty of discriminating the off state from the on state reduces circuit reliability. Conventional digital logic circuits also short internally when subjected to extreme environment because they may generate electrical currents inside the semiconductor material. It is possible to manufacture integrated circuits with special devices and isolation techniques so that they remain operational when exposed to extreme environment, but the high cost of these devices limits their availability and practicality. In addition, such digital circuits exhibit timing differences from their normal counterparts, requiring additional design verification to add protection to an existing design.

Integrated circuits constructed from either bipolar or FET switching elements are volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Important characteristics for logic circuits in an electronic device are low cost, high density, low power, and high speed. Conventional logic solutions are limited to silicon substrates, but logic circuits built on other substrates would allow logic devices to be integrated directly into many manufactured products in a single step, further reducing cost.

Devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94–97, 7 Jul., 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

U.S. Patent Publication No. 2003-0021966 discloses, among other things, electromechanical circuits, such as memory cells, in which circuits include a structure having electrically conductive traces and supports extending from a surface of a substrate. Nanotube ribbons that can electromechanically deform, or switch are suspended by the supports that cross the electrically conductive traces. Each ribbon comprises one or more nanotubes. The ribbons are typically formed from selectively removing material from a layer or matted fabric of nanotubes.

For example, as disclosed in U.S. Patent Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Publication No. 2003-0124325, three-trace architectures may be used for electromechanical memory cells, in which the two of the traces are electrodes to control the deflection of the ribbon.

The use of an electromechanical bi-stable device for digital information storage has also been suggested (c.f. U.S. Pat. No. 4,979,149: Non-volatile memory device including a micro-mechanical storage element).

The creation and operation of bi-stable, nano-electromechanical switches based on carbon nanotubes (including mono-layers constructed thereof) and metal electrodes has been detailed in a previous patent application of Nantero, Inc. (U.S. Pat. Nos. 6,574,130, 6,643,165, 6,706,402; U.S. patent application Ser. Nos. 09/915,093, 10/033,323, 10/033,032, 10/128,117, 10/341,005, 10/341,055, 10/341, 054, 10/341,130, 10/776,059, and 10/776,572, the contents of which are hereby incorporated by reference in their entireties).

SUMMARY

The invention provides nanotube device structures and methods of fabrication.

Under one aspect of the invention, a method of forming a nanotube switching element includes forming a first structure having at least one output electrode, forming a conductive article having at least one nanotube, and forming a second structure having at least one output electrode and positioning said second structure in relation to the first structure and the conductive article such that the output electrode of the first structure is opposite the output electrode of the second structure and such that a portion of the conductive article is positioned therebetween. At least one signal electrode is provided in electrical communication with the conductive article having at least one nanotube, and at least one control electrode is provided in relation to the conductive article such that the conductive electrode may control the conductive article to form a channel between the signal electrode and at least one of the output electrodes.

Under another aspect of the invention, the method provides a second control electrode in relation to the conductive article such that the second conductive electrode may control the conductive to uniform a channel between the signal electrode and at least one of the output electrodes, wherein the control electrode and the second control electrode are formed to be on opposite sides of the conductive article.

Under another aspect of the invention, the formation of the first and second structures creates a switching region cavity in which the conductive article is at least partially suspended such that it is electrostatically deflectable in response to electrical activation of at least one of the control electrode and the second control electrode.

Under another aspect of the invention, the first and second structures each include a respective second output electrode and wherein the second electrodes are positioned opposite each other with the conductive article positioned therebetween.

Under another aspect of the invention, the control electrode and the second control electrode includes an insulator layer on a surface facing the conductive article.

Under another aspect of the invention, the output electrode of one of the first and second structures includes an insulator layer on a surface facing the conductive article.

Under another aspect of the invention, the output electrode of one of the first and second structures includes an insulator layer on a surface facing the conductive article and wherein the second output electrode of the one of the first and second electrodes includes an insulator layer on a surface facing the conductive article.

Under another aspect of the invention, the upper surface of the nanotube switching element includes an area defining the control electrode and wherein the area includes at least one dimension that is sub-lithographic.

Under another aspect of the invention, the one control electrode if formed to have a first spaced relation to the conductive article, and wherein the second control electrode is formed to have a second spaced relation relative to the conductive article and wherein the first and second spaced relations have different magnitudes.

DETAILED DESCRIPTION

Preferred embodiments of the invention provide switching elements in which a nanotube-based channel may be controllably formed, under the influence of a control node, so that a signal may be transferred to an output node. The transferred signal may be a varying signal or a reference signal, depending on the manner in which the switching element is utilized and arranged. Preferred embodiments non-volatilely maintain the state of the nanotube switching element. Improved methods of manufacturing such devices are also provided.

Figure 1A:
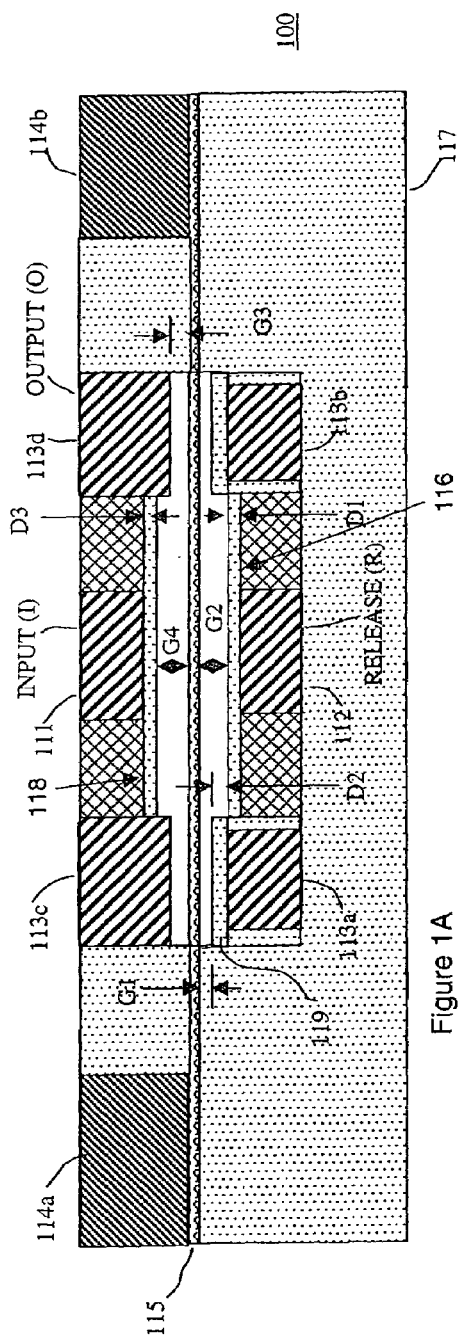
FIGS. 1A and 1B illustrate a cross sectional and plan views of a nanotube switching element fabricated according to preferred embodiments of the invention.

FIG. 1A is a cross sectional view of a preferred nanotube switching element 100. Nanotube switching element includes a lower portion having an insulating layer 117, release electrode 112, output electrodes 113a,b. Nanotube switching element further includes an upper portion having input electrode 111, output electrodes 113c,d, and signal electrodes 114a,b. A nanotube channel element 115 is positioned between and held by the upper and lower portions.

Release electrode 112 is made of conductive material and is separated from nanotube channel element 115 by an insulating layer (or film) 116 of thickness D1. The channel element 115 is separated from the facing surface of insulator 116 by a gap height G2.

Output electrodes 113a,b are made of conductive material and are separated from nanotube channel element 115 by an insulating layer (or film) 119 of thickness D2. The channel element 115 is separated from the facing surface of insulator 119 by a gap height G1.

Output electrodes 113c,d are likewise made of conductive material and are separated from nanotube channel element 115 by a gap height G3. Notice that the output electrodes 113c,d are not covered by insulator.

Input electrode 111 is made of conductive material and is separated from nanotube channel element 115 by an insulating layer (or film) 118 of thickness D3. The channel element 115 is separated from the facing surface of insulator 118 by a gap height G4.

Signal electrodes 114a,b each contact the nanotube channel element 115 and can therefore supply whatever signal is on the signal electrode to the channel element 115. This signal may be a fixed reference signal (e.g., Vdd or Ground) or varying (e.g., a Boolean discrete value signal that can change, or a continuous analog signal). Only one of the electrodes 114a,b need be connected, but both may be used to reduce effective resistance.

Nanotube channel element 115 is a lithographically-defined article made from a porous fabric of nanotubes (more below). It is electrically connected to signal electrodes 114a,b. The electrodes 114a,b and the upper and lower portions pinch or hold the channel element 115 at either end and it is suspended in spaced relation to the output electrodes 113a–d and the control electrodes 111 and 112 (also called input and release electrode respectively). The spaced relationship is defined by the gap heights G1–G4 identified above.

Figure 1B:
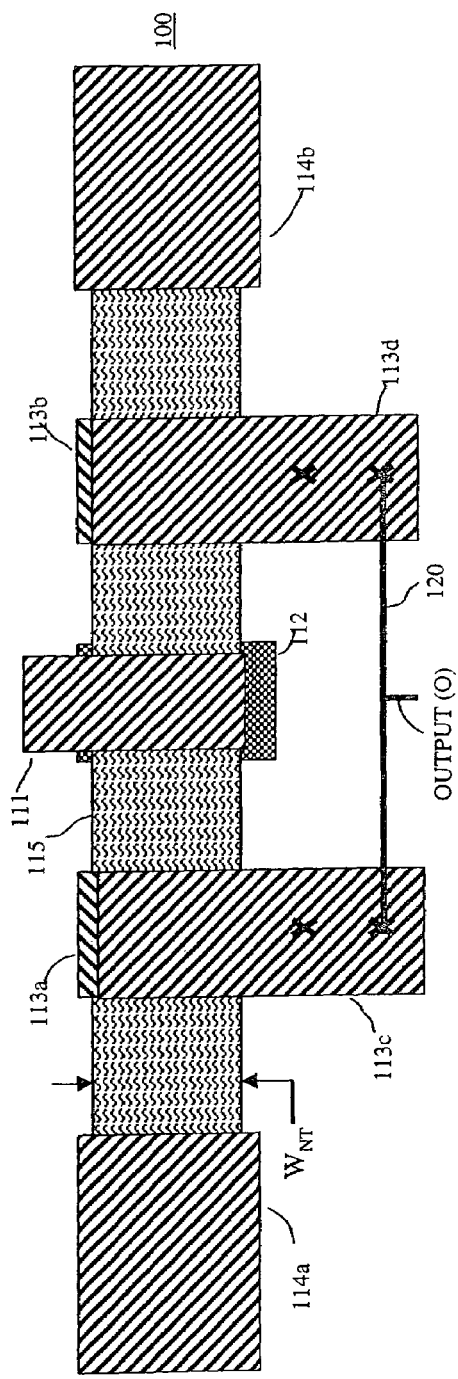

FIG. 1B is a plan view or layout of nanotube switching element 100. As shown in this figure, electrodes 113b,d are electrically connected as depicted by the notation 'X'. Likewise electrodes 113a,c are connected as depicted by the 'X'. In preferred embodiments the electrodes are further connected by connection 120. All of the output electrodes collectively form an output node of the switching element 100.

Figure 1C:
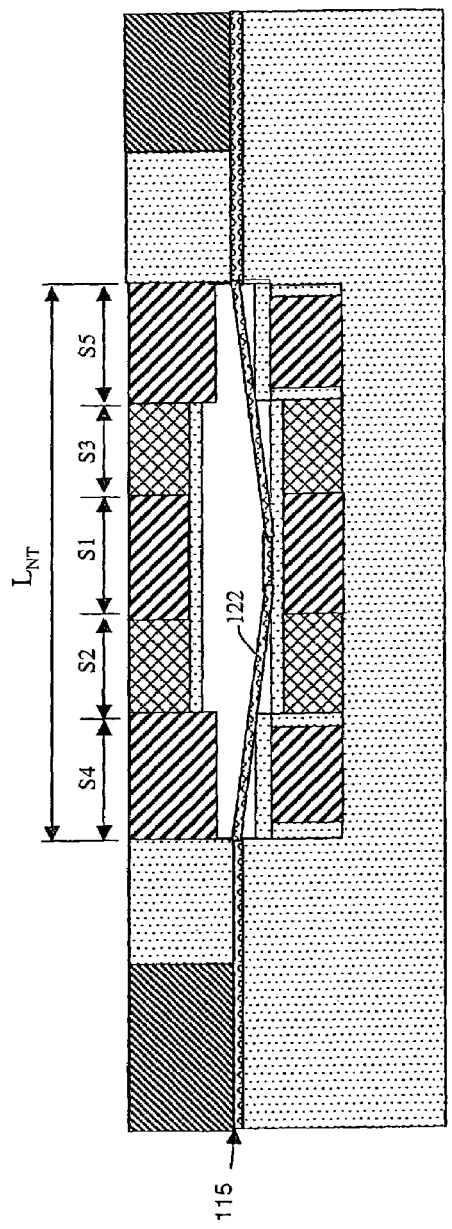
FIGS. 1C and 1D illustrate cross sectional views of different positional and electrical states of a nanotube switching element fabricated according to preferred embodiments of the invention.

Under preferred embodiments, the nanotube switching element 100 of FIGS. 1A and 1B operates as shown in FIGS. 1C and D. Specifically, nanotube switching element 100 is in an OPEN (OFF) state when nanotube channel element is in position 122. In such state, the channel element 115 is in mechanical contact with an underlying dielectric layer 116 in the switching region of the device. Van der Waals forces between channel element 115 and the underlying dielectric 116 exist. Output electrodes 113a,b are in mechanical contact, but not in electrical contact, with channel element 115. The Van der Waals forces are primarily controlled by selection of the proper width and length of the cell itself but the Van der Waals contacts can be affected by differences in material sets. The magnitude of the effect may be tuned with proper device fabrication techniques (e.g., alteration of the surfaces or nanotube modifications can be performed).

Figure 1D:
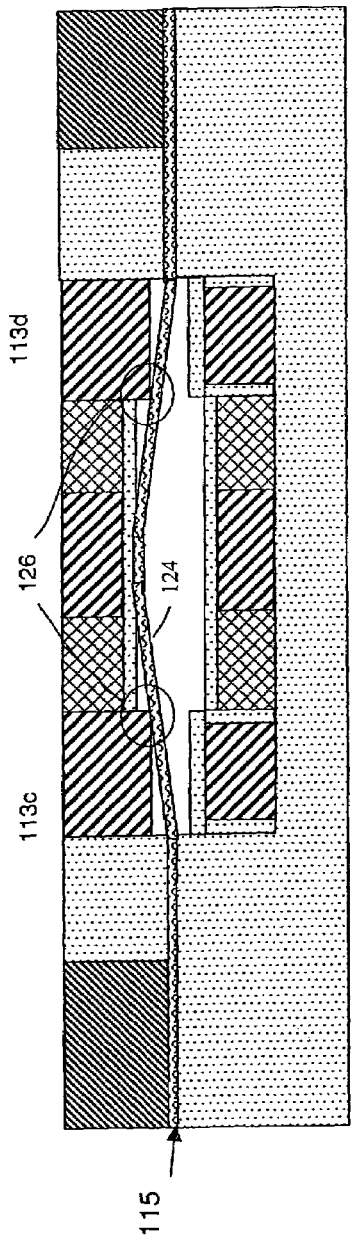

Nanotube switching element 100 is in a CLOSED (ON) state when channel element 115 is elongated to position 124 as illustrated in FIG. 1D. Output electrodes 113c,d are in mechanical contact and electrical contact with channel element 115 at regions 126. Consequently, when channel element 115 is in position 124, signal electrodes 114a and 114b are electrically connected with output terminals 113c,d via channel element 115, and the signal on electrodes 114a,b may be transferred via the channel (including channel element 115) to the output electrodes 113c,d. In positional state 124, channel element 115 is contacting the dielectric layer 118 below input electrode 111. Van der Waals forces between channel element 115 and the dielectric 118 exist to hold the channel element in this state.

By tailoring the geometry of nanotube switching element 100, the nanotube switching element 100 may be made to behave as a non-volatile or a volatile switching element. By way of example, tailoring the length to gap ratios may alter the behavior of the device: for length to gap ratio $L_{NT}$: G2 and $L_{NT}$: G4 of greater than 5 and less than 15, nanotube switching element 100 may operate in a non-volatile mode; for $L_{NT}$: G2 and $L_{NT}$: G4 ratios of less than 5, nanotube switching element 100 may operate in the volatile mode.

With reference to FIG. 1C, nanotube switching element 100 the length of the channel element 115 that is deflectable (and suspended) is $L_{NT}$. This length is divided by the widths of the output electrodes S4 and S5 and the input electrode S1 together with the separations therebetween S2 and S3 (which are filled with insulator). Thus, $L_{NT}$=S1+S2+S3+S4+S5. If the design has equal sized electrodes and equal sized insulator spaces, then S1=S2=S3=S4=S5, and $L_{NT}$=5 S1. The nanotube switching length $L_{NT}$ is practically limited by the length of the nanotubes that can practically and reasonably be created and used in forming the nanotube fabric from which the channel element 115 is formed (more late on nanotube fabric). For currently available nanotubes, the preferred longest value of $L_{NT}$ is about 300 to 350 nm. $L_{NT}$=325 nm is chosen for this example; therefore S1=65 nm, and S1=S2=S3=S4=S5=65 nm. However, nanotube lengths may exceed 350 nm, e.g., carbon nanotube fiber lengths may be formed in excess of 4 um.

Figure 2A:
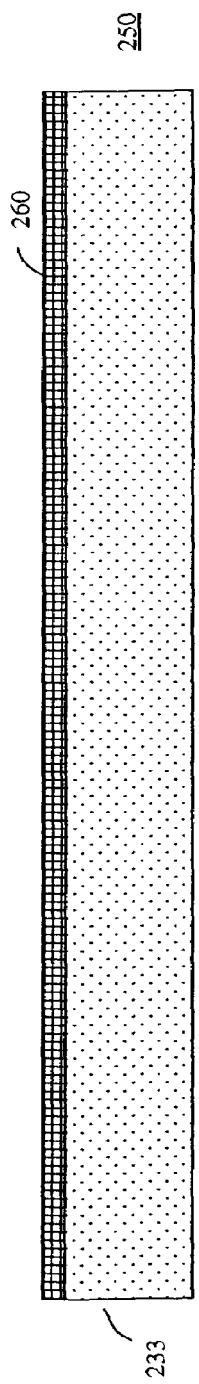
FIGS. 2A through 2OO illustrate sequential cross sections of intermediate structures formed in creating a nanotube switching element according to preferred embodiments of the invention.
Figure 2B:
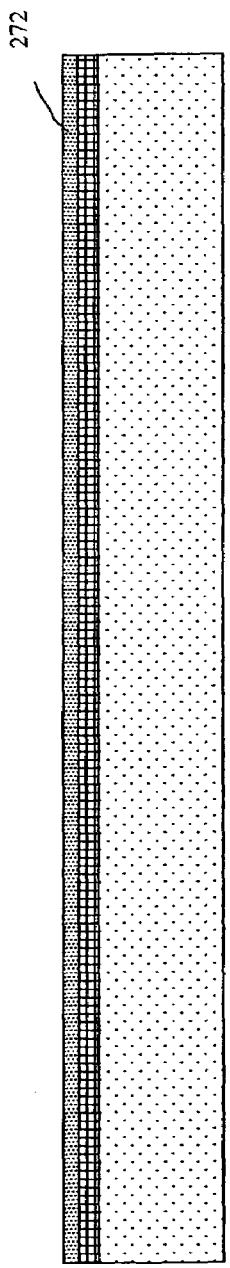
Figure 2C:
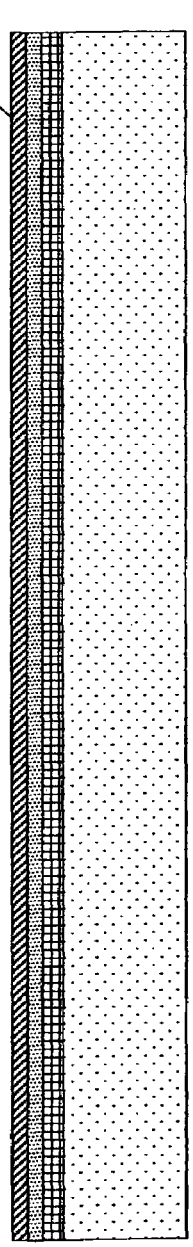
Figure 2D:
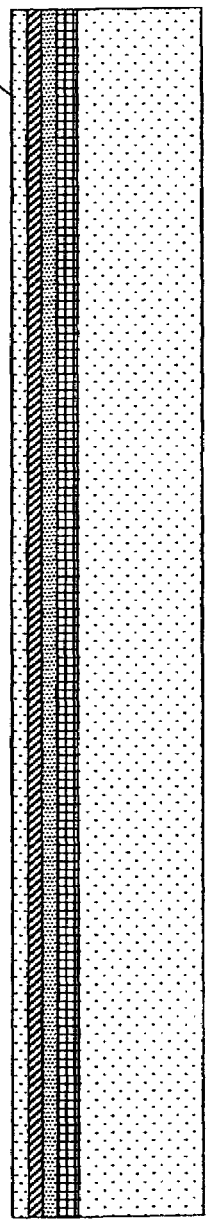
Figure 2E:
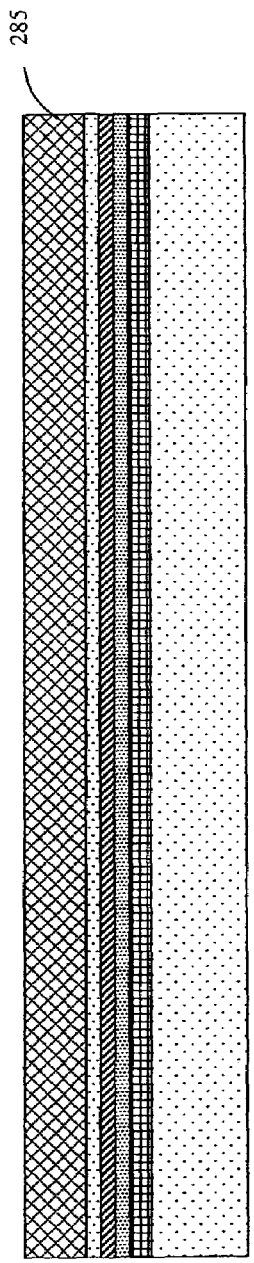
Figure 2F:
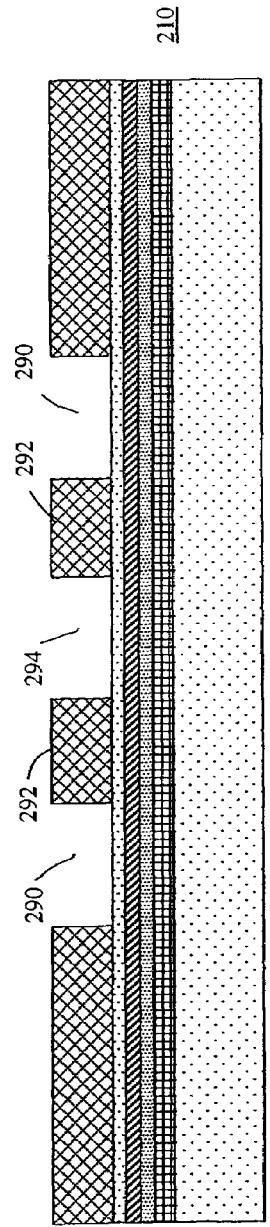
Figure 2G:
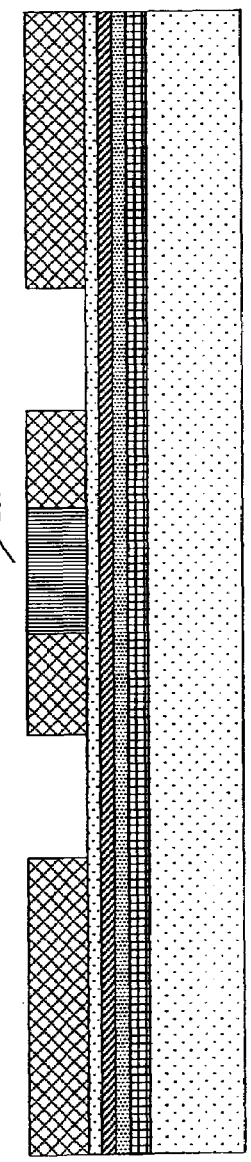
Figure 2H:
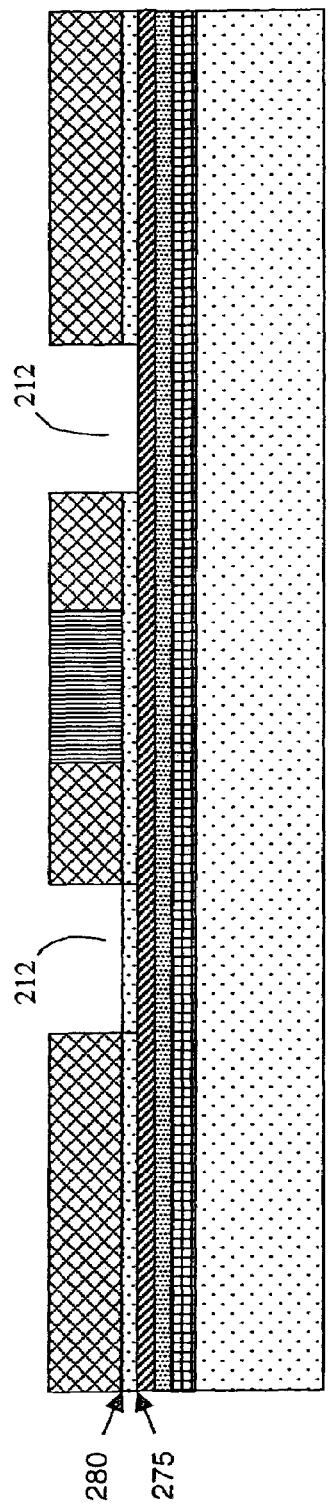
Figure 2I:
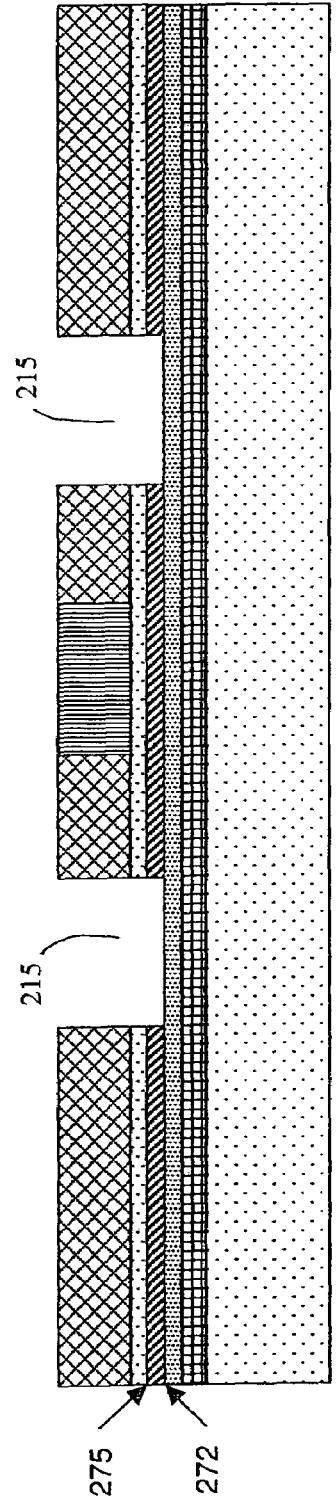
Figure 2J:
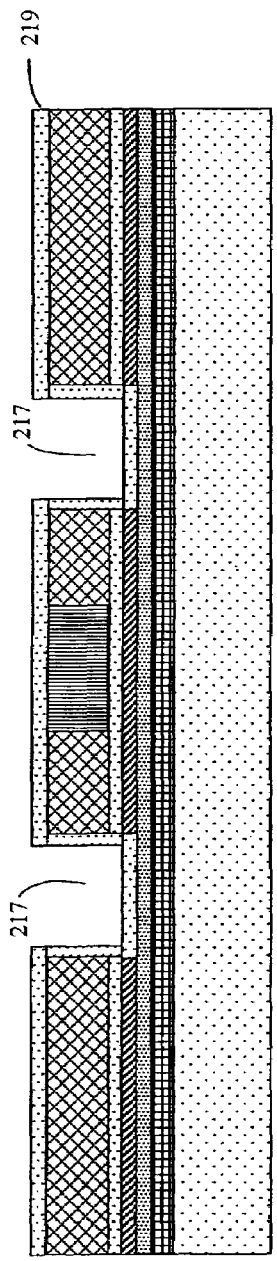
Figure 2K:
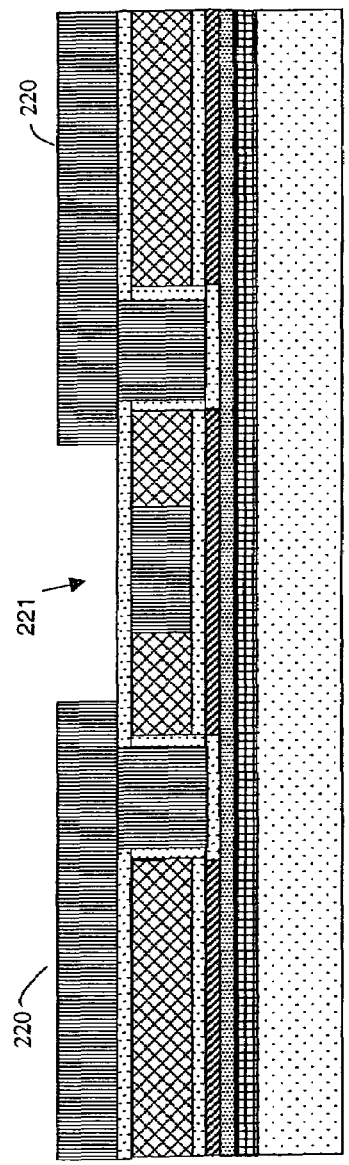
Figure 2L:
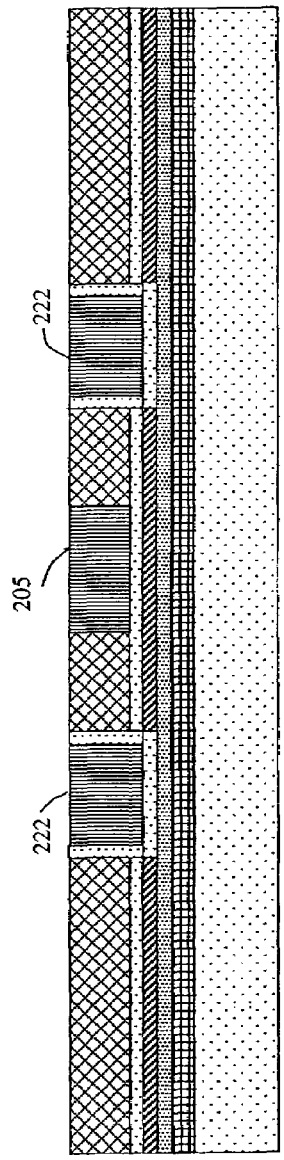
Figure 2M:
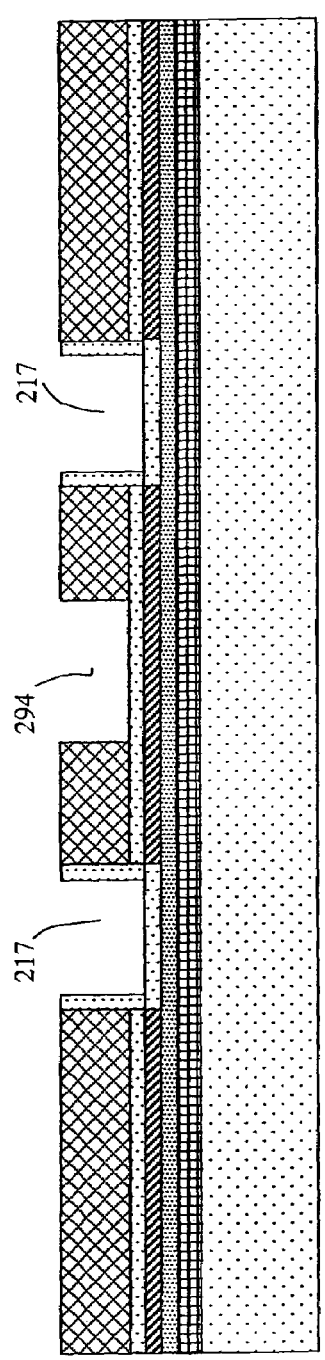
Figure 2N:
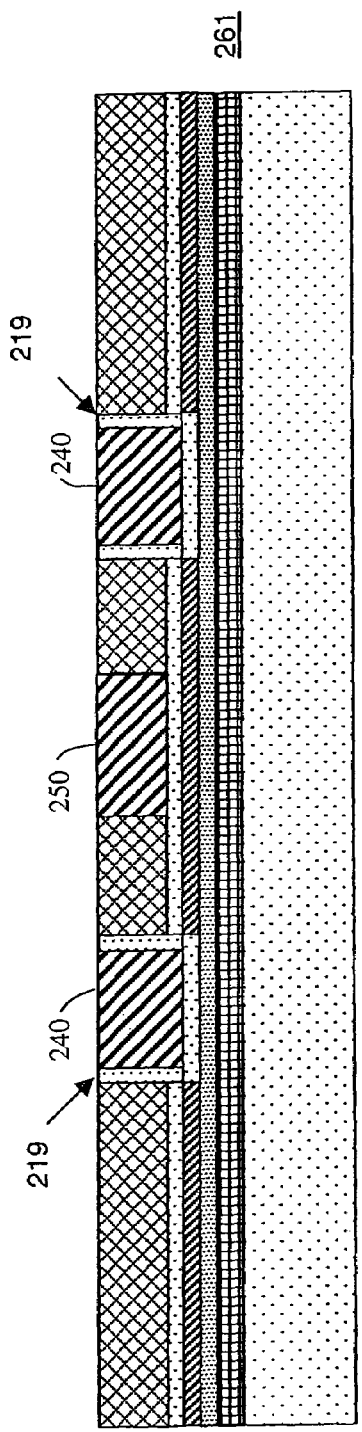
Figure 2Q:
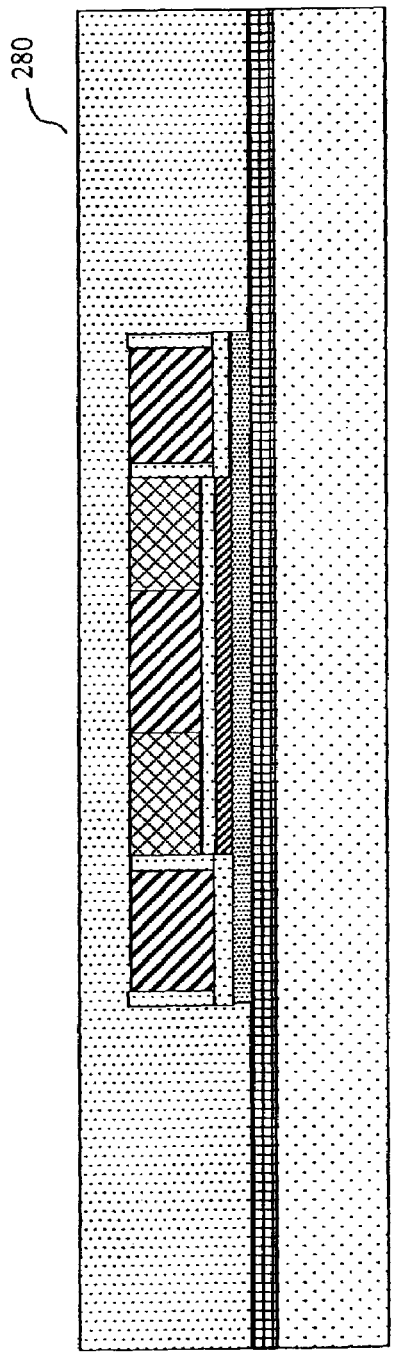
Figure 2R:
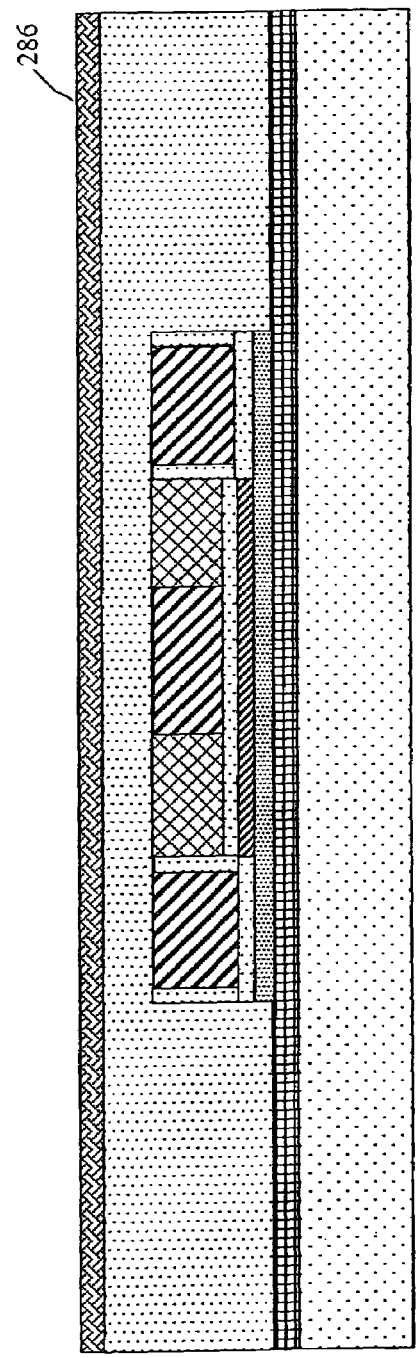
Figure 2S:
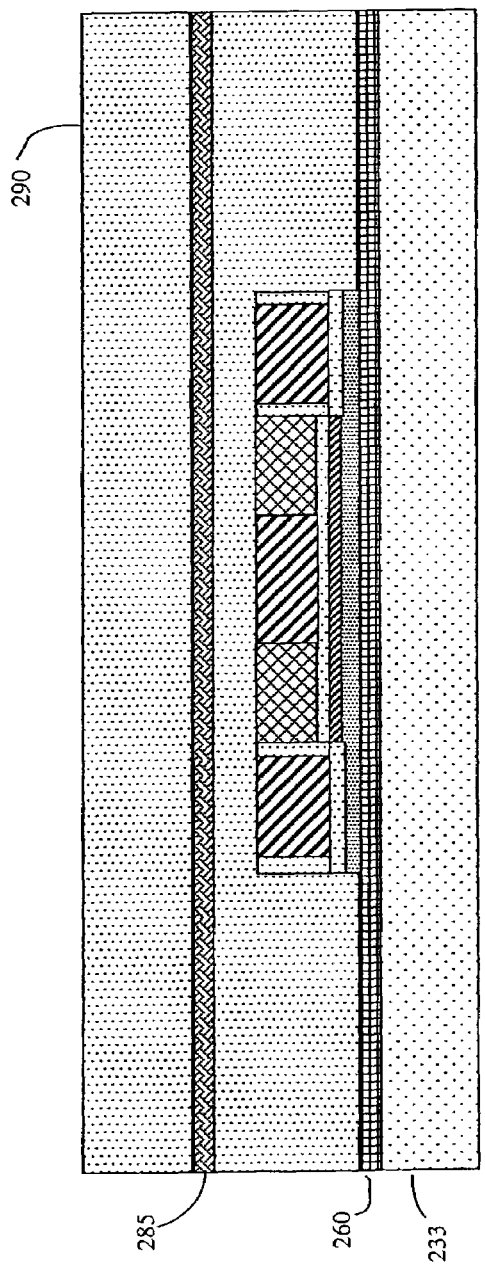
Figure 2T:
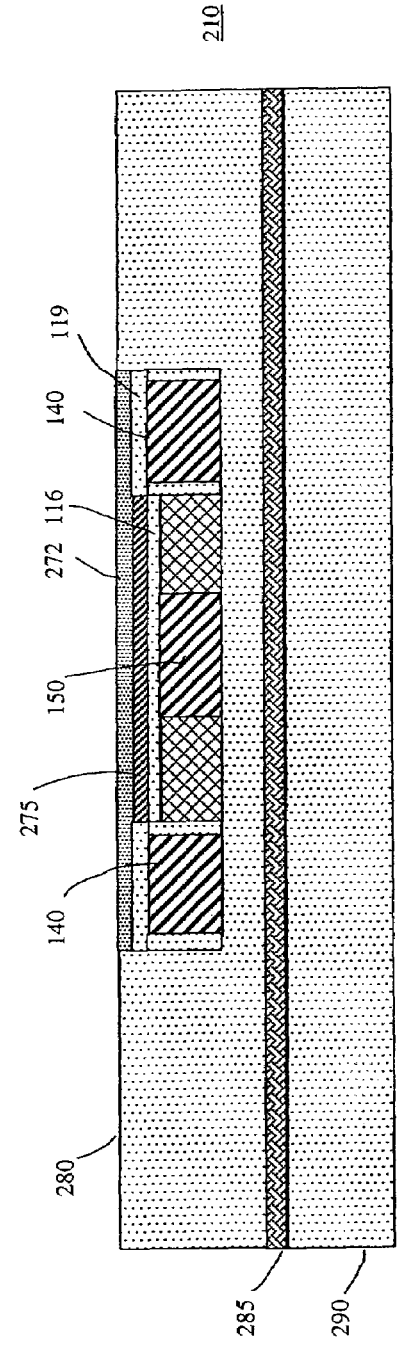
Figure 2U:
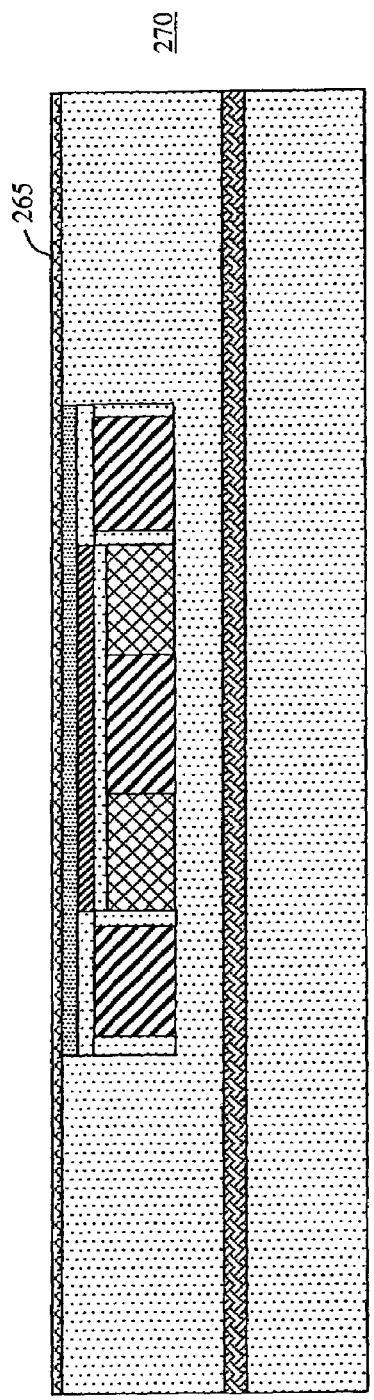
Figure 2V:
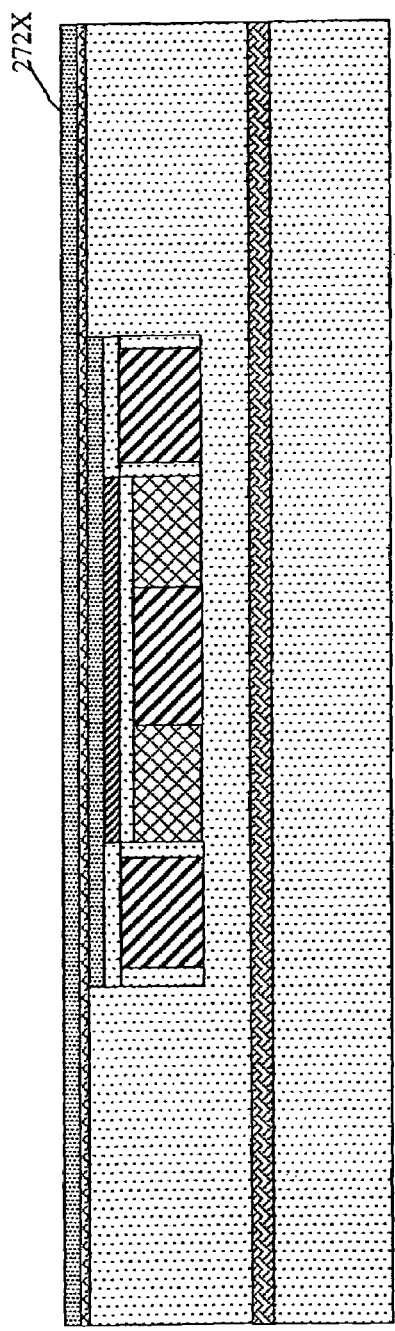
Figure 2Y:
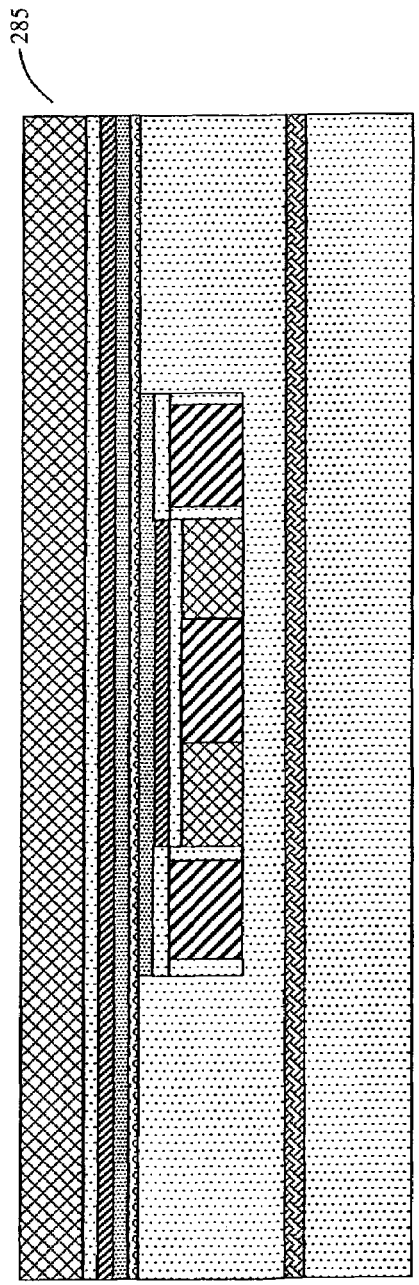
Figure 2Z:
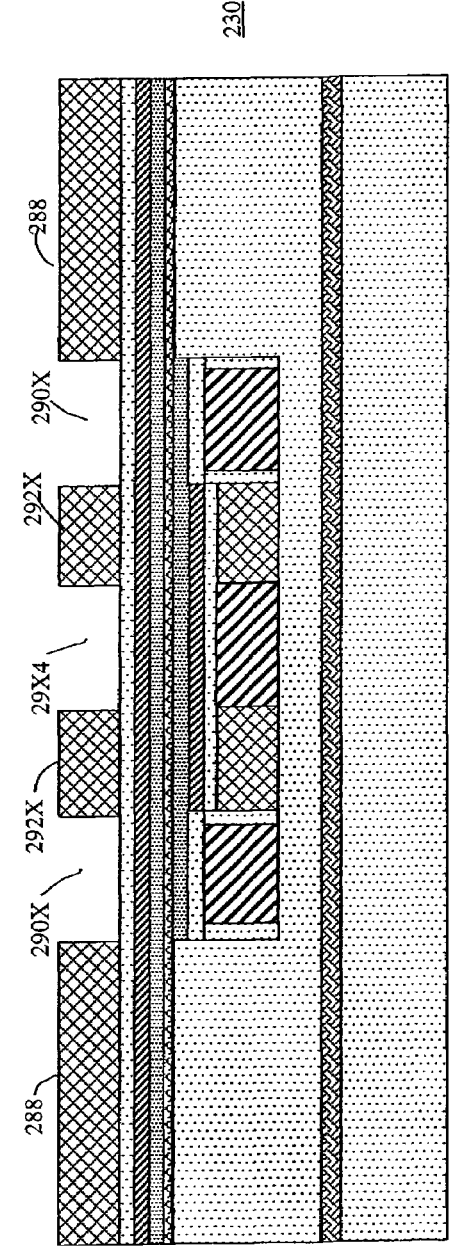
Figure 2I:
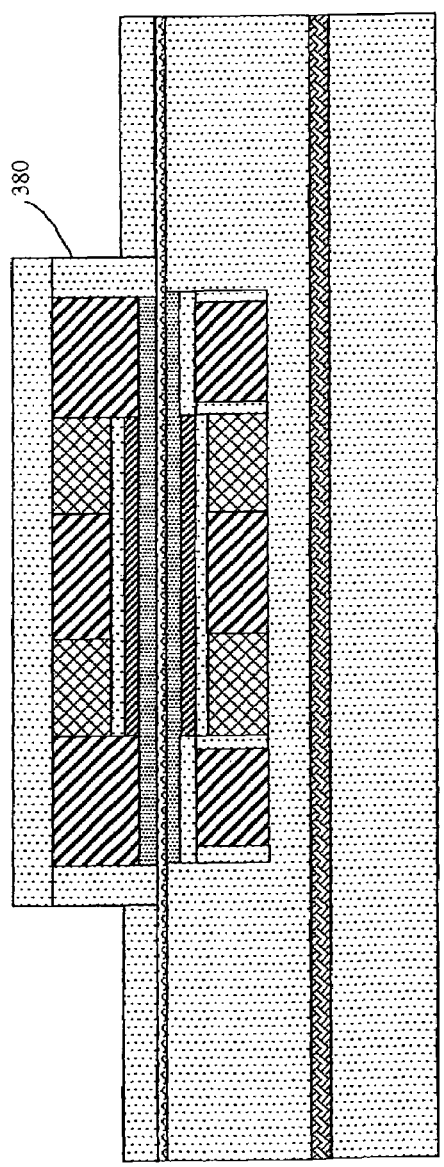
Figure 2J:
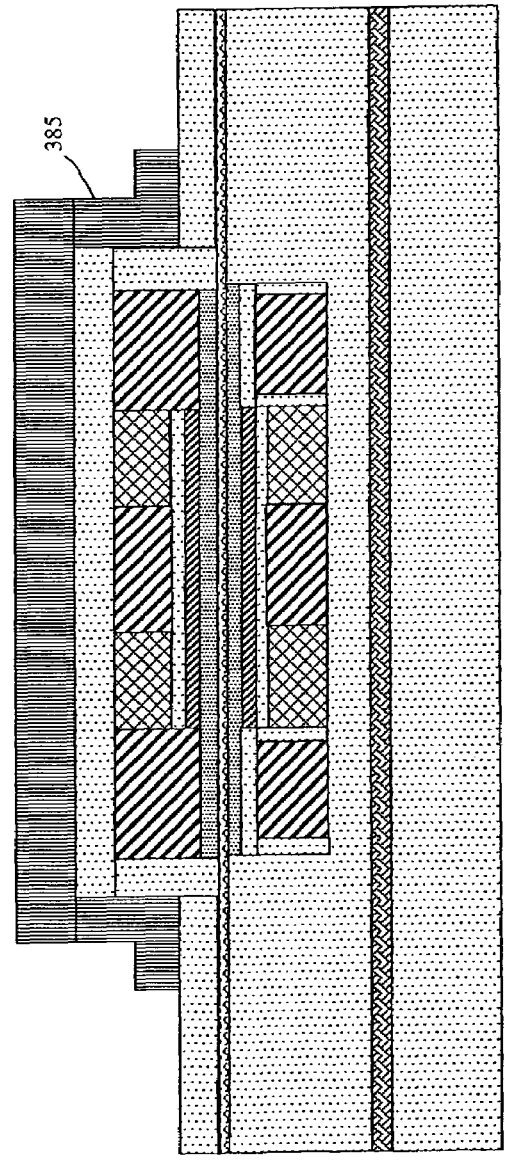
Figure 2K:
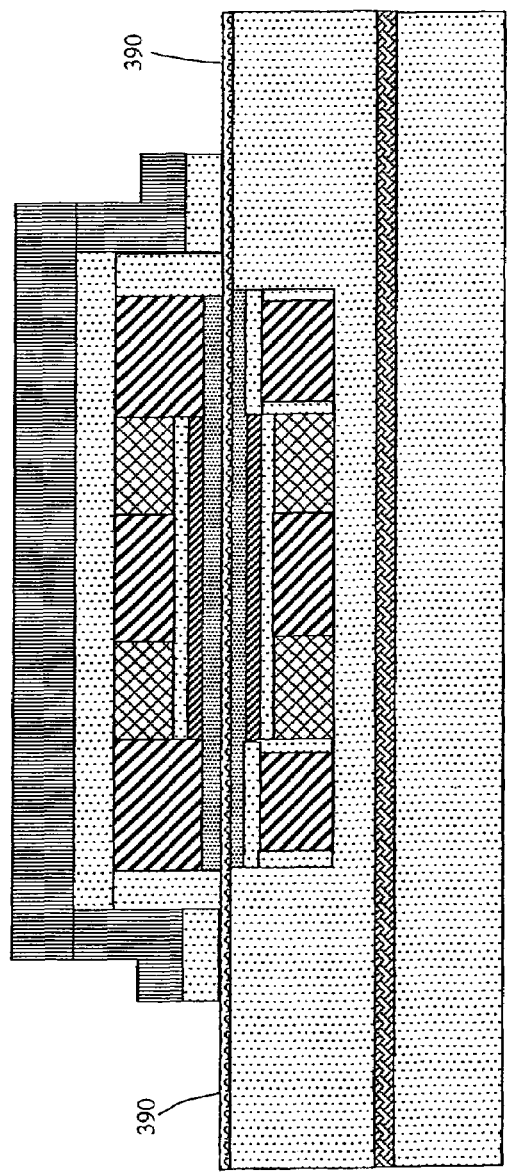
Figure 2L:
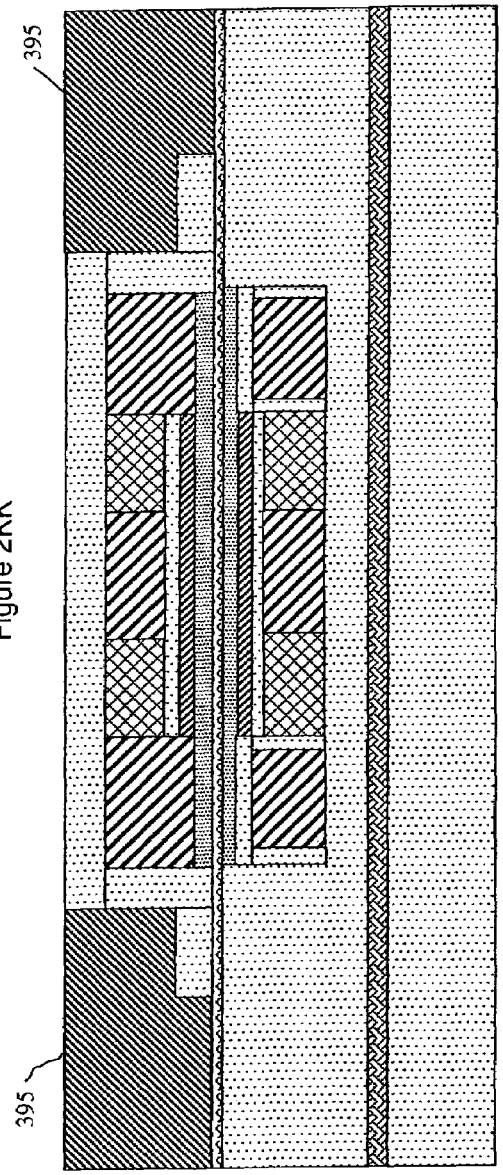
Figures 2M, 2N:
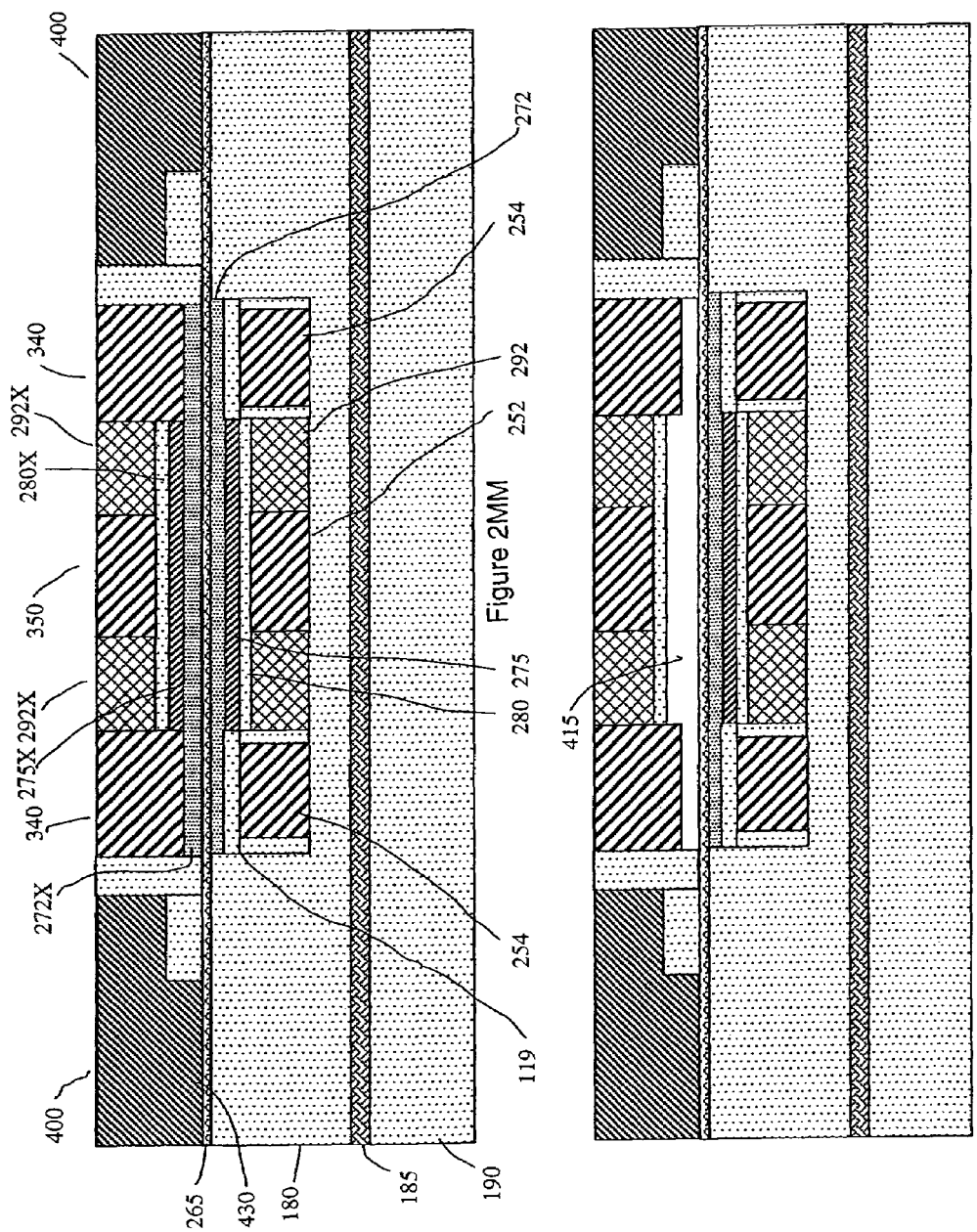
Figure 2O:
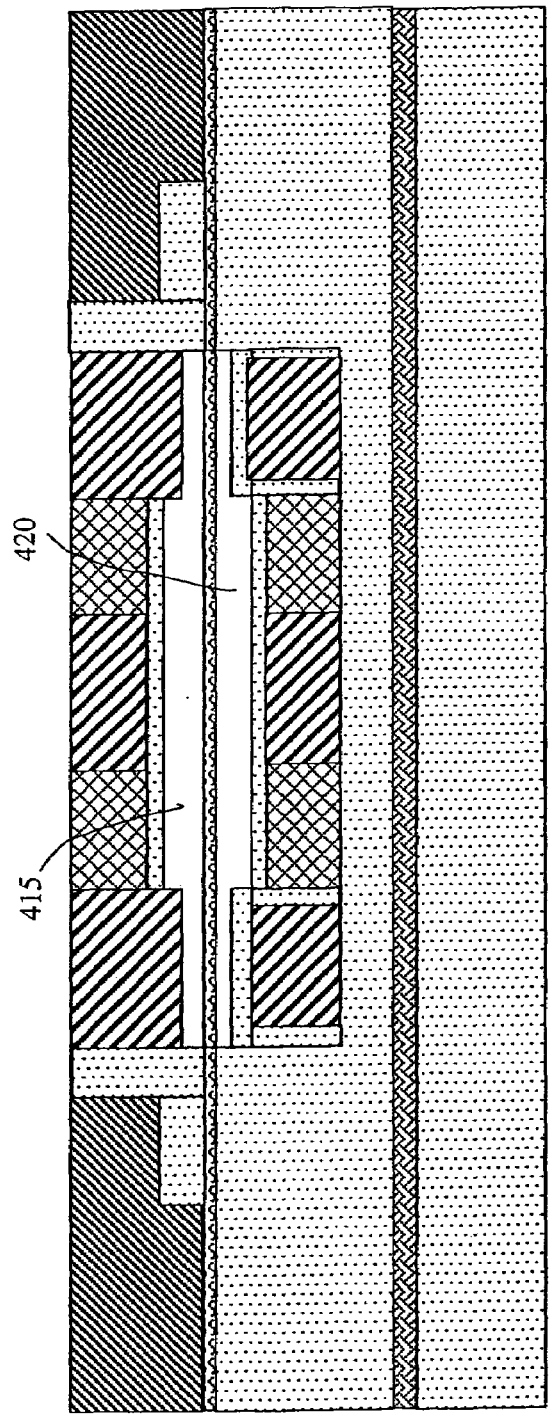

FIGS. 2A–2OO show the intermediate structures formed according to a preferred method of making nanotube switching elements like those of FIG. 1A.

FIGS. 2A–T show the intermediate structures formed in the creation of a lower structure for a nanotube switching element, according to preferred methods. FIG. 2U shows the step of forming a nanotube fabric or layer and of patterning and forming a nanotube article to become the nanotube channel element. FIGS. 2V–2OO show the intermediate structures formed in the creation of an upper structure, along with the completion of the device and its wiring.

An insulating substrate is first chosen. The insulator may be a ceramic substrate, an organic substrate such as polyimide, an organic substrate such as FR4, an organic layer (polyimide, for example) on a ceramic substrate, an organic (such as polyimide) on semiconductor, insulating layers such as $SiO_2$, $Si_3N_4$, $Al_2O_3$, or other insulating layers on a semiconductor or other substrate. The substrates may be flexible or rigid.

FIG. 2A illustrates intermediate structure 250 having planar substrate 233 having a planar separation layer 260 deposited on top of it. Separation layer 260 may be an insulating film, a semiconducting (doped or undoped) film, or a conductive film. Typical separation layer thicknesses may be in the range of 50 to 500 nm, for example.

Next, preferred methods steps deposit first sacrificial layer 272 on structure 250 as illustrated in FIG. 2B. First sacrificial layer 272 thickness is chosen such that the thickness of first sacrificial layer 272 eventually defines the separation thickness G1 illustrated in FIG. 1A. First sacrificial layer 272 may be silicon and have a thickness of about 5 to 30 nm, for example. Preferred methods of silicon deposition include sputtering or CVD Si deposition.

Next, preferred methods steps deposit second sacrificial layer 275 on the intermediate structure of FIG. 2B, resulting in the intermediate structure of FIG. 2C. Second sacrificial layer 275 is chosen such that its thickness plus the thickness of first sacrificial layer 272 defines the eventual separation thickness G2 illustrated in FIG. 1A. Second sacrificial layer 275 may be TiW and have a thickness of about 5 to 30 nm, for example.

Next, preferred methods steps deposit insulating layer 280 on the intermediate structure of FIG. 2C, resulting in the intermediate structure of FIG. 2D. Insulating layer 280 is chosen such that the thickness of layer 280 defines the separation thickness D1 illustrated in FIG. 1A. Insulating film 280 may be $SiO_2$ and have a thickness of about 5 to 30 nm, for example.

Next, preferred methods steps deposit insulating layer 285 on the intermediate structure of FIG. 2D, resulting in the intermediate structure of FIG. 2E. Insulating layer 285 is chosen such that the thickness of layer 285 is sufficiently thick to accommodate release electrode 112 and opposing output electrodes 113a,b of FIG. 1A. Insulating film 285 may be $Al_2O_3$ and have a thickness of about 50 to 300 nm, for example. As explained below, insulating film 285 may be later used as a masking layer to selectively remove portions of lower layer 280.

FIG. 2F illustrates intermediate structure 210 after forming openings in insulator layer 285 using a sacrificial mask structure. (Exemplary mask structures are described below.) The opening 294 defines the location of release electrode 112 of FIG. 1A. The openings 290 define the location of output electrodes 113a,b of FIG. 1A. The insulator regions 292 define the separation between release electrode 112 and output electrodes 113a,b. Openings 290 and 294 extend through layer 285 and have a depth of 50 to 300 nm, for example.

Next, preferred methods steps deposit, pattern, and planarize sacrificial masking material to form a layer 205 of sacrificial material in what was formerly opening 294, as illustrated in FIG. 2G. Sacrificial masking layer 205 may be formed using photoresist, insulator, semiconducting, or conducting material using standard processes.

Then, preferred methods steps remove (etch) exposed regions of SiO2 layer 280 to form openings 212 to the top surface of second sacrificial layer 275 as illustrated in FIG. 2H.

Then, preferred methods steps remove (etch) exposed regions of second sacrificial layer 275 to form opening 215 to the top surface of first sacrificial layer 272 as illustrated in FIG. 2I.

Next, preferred methods steps deposit a conformal insulating layer 219 on the surface of the intermediate structure of FIG. 2I, resulting in the intermediate structure of FIG. 2J. Insulating layer 219 may be SiO2 and have a thickness of about 5 to 30 nm, for example. Insulating layer 219 corresponds to insulating layer 119 in FIG. 1A.

Next, preferred methods steps deposit and pattern sacrificial masking layer 220 as illustrated in FIG. 2K. Sacrificial masking layer 220 may be formed using photoresist, insulator, semiconducting, or conducting material using standard processes.

Then, preferred methods steps remove (etch) the exposed portion 221 of insulator 219 above the area that will eventually have the release electrode. Then, preferred methods steps planarize the surface of the intermediate structure illustrated in FIG. 2K, resulting in the intermediate structure illustrated in FIG. 2L. Openings 217 are filled with sacrificial masking material 222, i.e., the remaining region of masking material 220. Opening 294 is still filled with sacrificial masking material 205 from previous method steps. Alternatively, one can CMP film 220 used to fill opening 217 without an opening 221 step and etch. If film 220 is removed by CMP, then 219 is left exposed, except in filled regions 217. A directional etch can remove film 219, leaving the vertical film regions on the sides of 222 as desired.

Then, preferred methods steps remove (etch) sacrificial masking material 205, exposing opening 294, and sacrificial masking material 222, exposing openings 217, as illustrated in FIG. 2M. At this point in the method (process), openings 294 and 217 are ready to be filled with a conductor (or semiconductor) material to define release electrode 112 and output electrodes 113a,b as illustrated in FIG. 1A.

Next, the openings 294 and 217 are filled with a conducting material such as aluminum, tungsten, copper, titanium, chromium, palladium, etc., then planarized, resulting in structure 261 illustrated in FIG. 2N. This creates intermediate electrodes 240 and 250 made of the same conductor material. Electrodes 240 correspond to output electrodes 113a,b, and electrode 250 corresponds to release electrode 112 of FIG. 1A. Structure 261 corresponds to the lower portion of the nanotube switching element 100 illustrated in FIG. 1A.

Next, preferred methods steps deposit and pattern sacrificial mask layer 270 as illustrated in FIG. 2O using standard photoresist processes.

Then, preferred methods steps remove (etch) exposed portions 288 of insulator 285 (see FIG. 2E), exposed portions 287 of insulator layer 280, exposed portions 289 of second sacrificial layer 275, and exposed portions of first sacrificial layer 272. This exposes a region 275 of separation layer 260, on sacrificial substrate 233, as illustrated in FIG. 2P. Preferred methods steps remove insulator layer 287 via directional etching. Under certain embodiments, etch insulator 285 (may be Al2O3, for example) is selective to SiO2 and conductors 240. One can directionally etch of layer 287, usually SiO2, which will also remove a smaller upper portion of the vertical 219 vertical insulator, which is also SiO2 that will be filled in with TEOS at a later step. One can directionally etch 289 to remove this portion of sacrificial layer outside device switching region. This layer may be formed (typically) TiW so it can be selectively etched as well. And one can directionally etch a portion of sacrificial layer 272 outside of device switching region forming opening 275. Then one can etch (remove) masking layer 270 using conventional methods (not shown). Layer 287 is typically a thin layer of SiO2; therefore, when directionally etched it will also remove a very small portion of the vertical portion of SiO2 sidewall 219. Directional etch is used here to minimize the removal of the top of sidewall 219. Any step that removes a hard mask layer such as a photoresist layer, for example, may get rid of layer 270.

Next, preferred methods steps deposit encapsulating insulator 280 on the structure of FIG. 2P and fills the openings 275. An oxide such as TEOS may be used, for example. The insulating layer is then planarized, resulting in the structure as illustrated in FIG. 2Q.

Next, preferred methods steps deposit bonding layer 286 on encapsulating insulator 280 shown in FIG. 2Q, resulting in the intermediate structure illustrated in FIG. 2R. Bonding layer 286 is used when attaching a final substrate to the lower device structure as described below.

Next, preferred methods steps attaches substrate 290 to bonding layer 285 as illustrated in FIG. 2S. The substrate may be insulating, semiconducting, conductive, rigid, or flexible. Bonding layer 285 may not be required for some methods of attachment. For example, $SiO_2$ to $SiO_2$ attachment may be formed using elevated temperature and pressure. Substrate 290 may contain previously processed structures such NFET and PFET devices and wiring, for example.

Next, preferred methods steps removes (etches) sacrificial substrate 233, exposing separation layer 260. Sacrificial substrate 233 may be removed using chemical mechanical polishing (CMP), for example, using separation layer 260 as an etch stop.

Next, preferred method steps remove (etches) separation layer 260, resulting in structure 210 illustrated in FIG. 2T. The surface of structure 210 is cleaned to prepare it for deposition of a nanotube fabric layer. At this point in the method (process), a lower device structure 210 is completed.

At this point in the method (process), the deposition of a nanotube fabric layer on structure 200 may occur. Preferred methods form carbon nanotube layer 265 as illustrated in FIG. 2U. This may be done with spin-on techniques or any other appropriate techniques as described in U.S. Patent references incorporated herein. Under preferred embodiments, the carbon nanotube layer 265 has a thickness of approximately 1–5 nm for devices using single-walled nanotubes and a thickness of approximately 5–20 nm and greater for devices using multi-walled nanotubes. The resulting intermediate structure 270 is shown in FIG. 2U. The layer is then lithographically patterned and portions are removed to create ribbon like structures for the eventual channel element. The techniques for such patterning and forming are discussed in the patent references incorporated herein.

Next, preferred method steps deposit third sacrificial layer 272X on the intermediate structure of FIG. 2U, to result in the intermediate structure of 2V. Sacrificial layer 272X is chosen such that the thickness of film 272X defines the thickness (separation) G3 of FIG. 1A. Insulating film 272X may be silicon and have a thickness of about 5 to 30 nm, for example. Preferred methods of silicon deposition include sputtering or CVD silicon deposition. Third sacrificial layer 272X may not be equal in thickness to first sacrificial layer 272. That is, the device is not necessarily symmetrical in gap, and oxide thicknesses. In this fashion, restoring forces relative to contact forces may be tailored to address the issue of shoot through current as discussed in some of the related patent applications. Alternatively, electrodes may also be somewhat different in widths, for example, to tailor the relevant forces.

Next, preferred method steps deposit fourth sacrificial layer 275X on the intermediate structure of FIG. 2V, resulting in the intermediate structure of FIG. 2W. Fourth sacrificial layer 275X is chosen such that the thickness of layer 275X plus the thickness of layer 272 thickness defines the thickness (separation) G4 of FIG. 1A. Fourth sacrificial layer 275X may be TiW and have a thickness of about 5 to 30 nm, for example. Fourth sacrificial layer 275X may not be equal in thickness to second sacrificial layer 275.

Next, preferred method steps deposit insulating layer 280X on the intermediate structure of FIG. 2W, resulting in the intermediate structure of FIG. 2X. Insulator layer 280 is chosen such that the thickness of layer 280X defines the thickness D3 of FIG. 1A. Insulating layer 280X may be $SiO_2$ and have a thickness of about 5 to 30 nm, for example. Insulating layer 280X may not be equal in thickness to insulating layer 280.

Next, preferred method steps deposit insulating layer 285 on the intermediate structure of FIG. 2X, resulting in the intermediate structure of FIG. 2Y. Insulating layer 285 is chosen such that the thickness of layer 285 is sufficiently thick to accommodate input electrode 111 and output electrodes 113c,d of FIG. 1A. Insulating layer 285 may be $Al_2O_3$ and have a thickness of about 50 to 300 nm, for example. As explained below, in this manner insulating layer 285 may used as a masking layer selective to layer 280X.

FIG. 2Z illustrates intermediate structure 230 after method steps generate openings in insulator layer 285 using a sacrificial mask structure (more below on mask structures). The opening 294X defines the location of input electrode 111 of FIG. 1A. Openings 290X define the location of output electrodes 113c,d. Insulator regions 292 separate the eventual input electrode 111 and output electrodes 113c,d. Openings 290 and 294X extend through layer 285 and have a depth of 50 to 300 nm, for example.

Next, preferred method steps deposit and pattern sacrificial mask layer 305 as illustrated in FIG. 2AA using standard photoresist processes. This mask layer, among other things, fills opening 294X.

Then, preferred method steps remove (etch) exposed regions of $SiO_2$ layer 280 X to form openings 310 to the top surface of fourth sacrificial layer 275X as illustrated in FIG. 2BB.

Then, preferred method steps remove (etch) exposed regions of fourth sacrificial layer 275X to form opening 315 to the top surface of third sacrificial layer 272X as illustrated in FIG. 2CC.

Then, preferred method steps remove (etch) sacrificial mask layer 305, exposing opening 294X as illustrated in FIG. 2DD. At this point in the method, openings 294X and 315 are ready to be filled with a conductor (or semiconductor) material to define input electrode 111 and output electrodes 113c,d as illustrated in FIG. 1A.

Next, the openings 294X and 315 are filled with a conducting material such as aluminum, tungsten, copper, titanium, chromium, palladium, etc. They may then be planarized, resulting in intermediate structure 360 illustrated in FIG. 2EE showing electrodes 340 and 350 made of the same conductor material. Electrodes 340 correspond to eventual output electrodes 113c,d, and electrode 350 corresponds to eventual input electrode 111 of FIG. 1A.

Alternatively, structure 360' uses a first conductor type such as tungsten, titanium, chromium, or palladium shown as conductor 342 and 352 in FIG. 2FF to minimize contact resistance and maximize cyclability (the number of cycles device ON-OFF cycles) between the output electrodes 113c,d and nanotube channel element 115. Structure uses a second conductor, such as tungsten, aluminum, copper, and other conductors for the upper portion of electrodes 340 and the upper portion of electrode 350. At this point in the method, the nanotube switching region is defined, with first and sacrificial layers to be removed (etched) further down in the process flow.

Next, preferred method steps deposit and pattern sacrificial mask layer 370 as illustrated in FIG. 2GG using standard photoresist processes.

Then, preferred method steps remove (etch) exposed portions of insulator 288, insulator layer 280, fourth sacrificial layer 275X, and third sacrificial layer 272X, exposing a region 375 of nanotube fabric layer 265 as illustrated in FIG. 2HH.

Next, conformal insulating layer 380 is deposited on the intermediate structure of FIG. 2HH to yield the intermediate structure of FIG. 2LL.

Next, preferred method steps deposit and pattern sacrificial mask layer 385 as illustrated in FIG. 2JJ using standard photoresist processes.

Then, preferred methods steps remove (etch) exposed portions of insulator 380 exposing nanotube layer 265 in regions 390 as illustrated in FIG. 2KK.

Next, preferred method steps deposit (fill) exposed regions 390 with a contact and wiring layer 395 that contacts nanotube layer 265 in contact region 390 as illustrated in FIG. 2LL. Alternatively, wiring layer 395 may be fabricated as two layers (not shown) similar to the approach used in creating structure 360' shown in FIG. 2FF, such that a lower layer in contact with nanotube layer 265 in region 390 is optimized for low contact resistance using conductors such as tungsten, titanium, chromium, or palladium, and an upper layer is optimized for electrode (terminal) contact and wiring using such conductors as tungsten, aluminum, copper, and other conductors. The material used in the fabrication of the electrodes and contacts used in the nanotube switches is dependent upon the specific application; i.e. there is no specific metal necessary for the operation of the present invention. Materials such as cobalt, silicides, poly or alloys may be useful for specific embodiments.

Next, preferred method steps planarize the surface of the intermediate structure illustrated in FIG. 2LL, resulting in the intermediate structure of FIG. 2MM. This structure has terminals 340 and 350 exposed. Then, contacts 395 may be planarized to contacts 400 with top surfaces at the same level as top surfaces of terminals 340 and 350. (This method step is optional.)

Next, preferred method steps etch via holes (not shown) to the top surface of the remaining fourth sacrificial layer in the switching region of the nanotube switching element, forming fluid communication paths to the remaining fourth sacrificial layer 275X. These paths are used to remove the fourth sacrificial gap material 275X in the switching regions of the device. Next, these fluid communication paths are used to remove the remaining third sacrificial layer 272X in the device switching regions of the device to complete the formation of gap region 415 illustrated in FIG. 2NN. Next, these fluid communication paths are used to remove the remaining first sacrificial layer 272 below porous nanotube fabric layer 265. Preferred method steps etch through porous nanotube fabric layer as is described in the above-mentioned and incorporated patent references. Next, these fluid communications paths are used to remove the remaining second sacrificial layer 275 creating gap 420 illustrated in intermediate structure 450 illustrated in FIG. 2OO. At this point in the process, via holes are filled (not shown), and the nanotube switching element is planarized.

The device structure 450 of FIG. 4OO is ready for wiring. Electrical contact 116 illustrated in FIG. 1B may be formed away from the switching region during the wiring process, or may be formed prior to the wiring process, during the fabrication of device structure 450 (contact 116 is not shown in structure 450 cross section). Extension of electrodes may also be used for wiring between nanotube switching elements 100. Nanotube electrode (terminal) 400 contacts nanotube fabric element 265 at contact 430, and where electrodes 400 of structure 450 shown in FIG. 2MM correspond to electrodes 114a,b of structure 100 of FIG. 1A. Nanotube fabric layer 265 of structure 450 corresponds to nanotube channel element 115 of nanotube switching element 100 of FIG. 1A. Gap 415 of structure 450 forms separation regions defined by G3 and G4 in switching element 100. Gap 420 of structure 450 forms separation regions defined by G1 and G2 in switching element 100. Electrode 252 in substrate region 180 of structure 450 corresponds to release electrode 112 in substrate 117 of switching element 100, and electrodes 254 correspond to opposing electrodes 113a,b of switching element 100. Electrode 350 of structure 450 corresponds to input electrode 111 of switching element 100. Electrodes 340 of structure 450 correspond to output electrodes 113c,d of switching element 100. At this point in the method operational nanotube switching elements 100 have been fabricated and are ready for final interconnect wiring, terminal metallurgy, and insulation (not shown).

As stated above, under certain embodiments, a nanotube switching element 100 like that of FIG. 1A has elements, such as electrodes 111, with a width S1 of about 65 nm in the $L_{NT}$ direction. Methods and masks are needed to define features of this size.

Figure 3A:
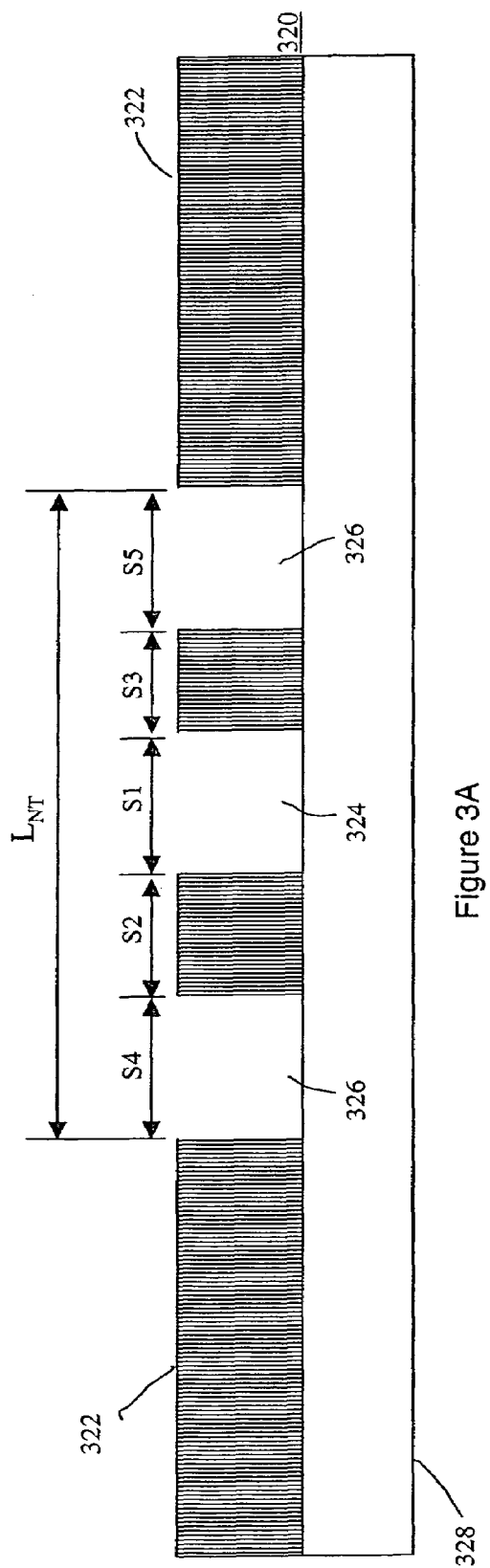
FIGS. 3A and 3B illustrate a direct exposure mask method in cross section and in plan view respectively, according to preferred embodiments of the invention.
Figure 3B:
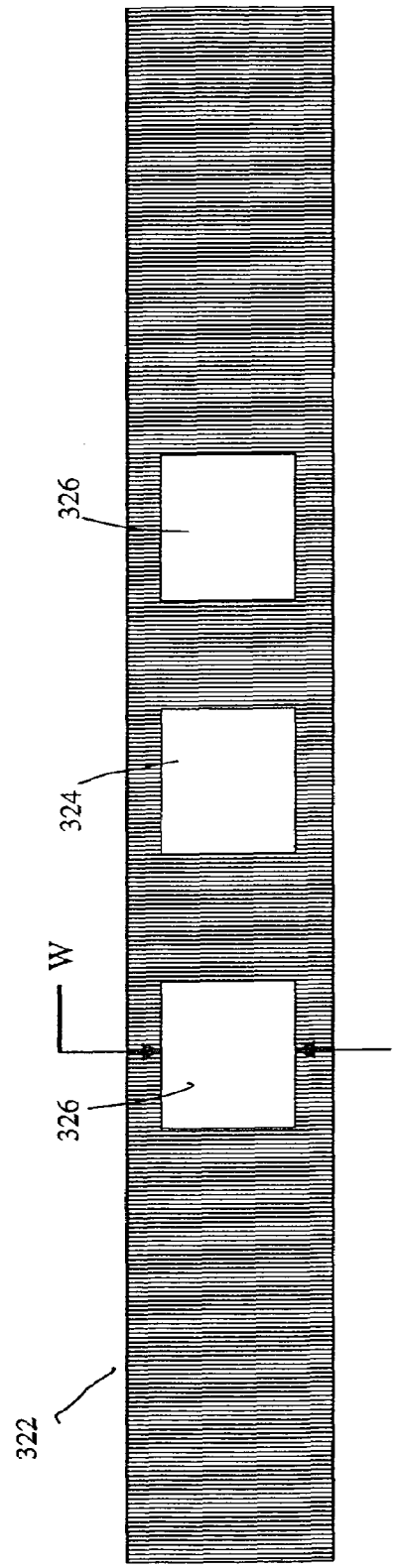

FIG. 3A illustrates a method of forming such features using direct exposure. As is illustrated in cross section 320, a sacrificial masking layer 322 on substrate 328 has openings 324 and 326 formed directly therein. FIG. 2B illustrates a corresponding plan view of a sacrificial masking layer 322 with openings 324 and 326 used to define the electrode shapes S1–S5, where shapes S1–S5 are of width W. Substrate 328 includes the corresponding intermediate structure (described above) that is formed before defining the electrode shapes Fabrication of the sacrificial mask structure 322 assumes availability of direct exposure and photoresist technology compatible with 65 nm minimum dimensions for the two electrode definition layers described. If, however, a minimum dimension of only 130 nm is available, then the 65 nm minimum dimension consistent with $L_{NT}$=325 nm must be achieved by an alternate method.

A sacrificial masking layer similar to masking layer 322 may be formed using a 130 nm photoresist process and conformal layers of insulators such as $SiO_2$, $Si_3N_4$, $Al_2O_3$, metals such as aluminum, tungsten, copper, titanium, metal alloys such as TiW, and semiconductors such as silicon.

Figure 4A:
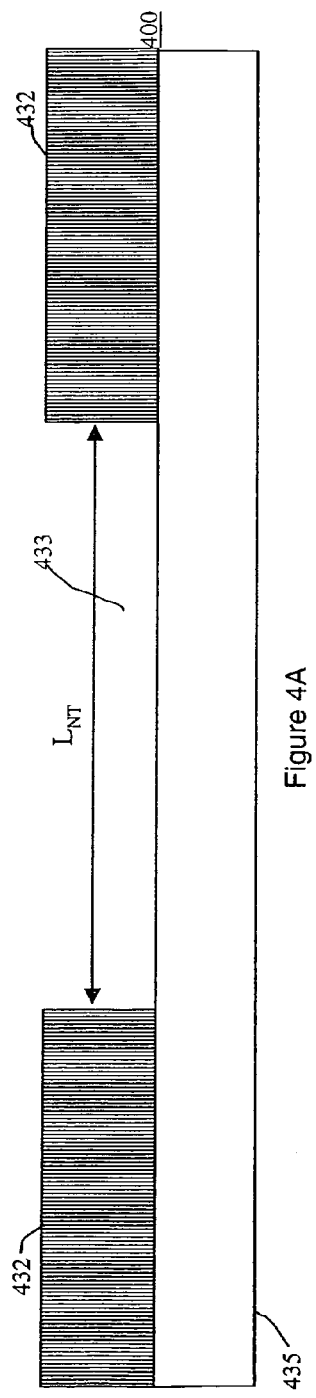
FIGS. 4A–G illustrate sequential cross sections of mask structures according to preferred embodiments of the invention.

FIG. 4A illustrates a mask structure 400 of an alternate mask method to generate sub-lithographic dimensions on substrate 435. Substrate 435 includes whatever intermediate structure is formed before definition of the electrode spaces (as described above). For this example, 65 nm sub-lithographic dimensions are formed using a 130 nm minimum dimension mask process, combined with layers of conformal sacrificial films of controlled thickness. The sub-minimum dimension masking method is used to define sub-minimum dimensions for electrodes 112 and 113a,b and sub-lithographic dimensions for electrodes 111 and 13c,d.

Mask structure 400 has opening 433 of length $L_{NT}$ and width $W_{NT}$ (not shown) formed in sacrificial mask layer 432. Sacrificial masking layer 432 may be formed using photoresist, insulators such as $SiO_2$, $Si_3N_4$, $Al_2O_3$, metals such as aluminum, tungsten, copper, titanium, metal alloys such as TiW, and semiconductors such as silicon. $L_{NT}$ is equal to 325 nm, for example.

Figure 4B:
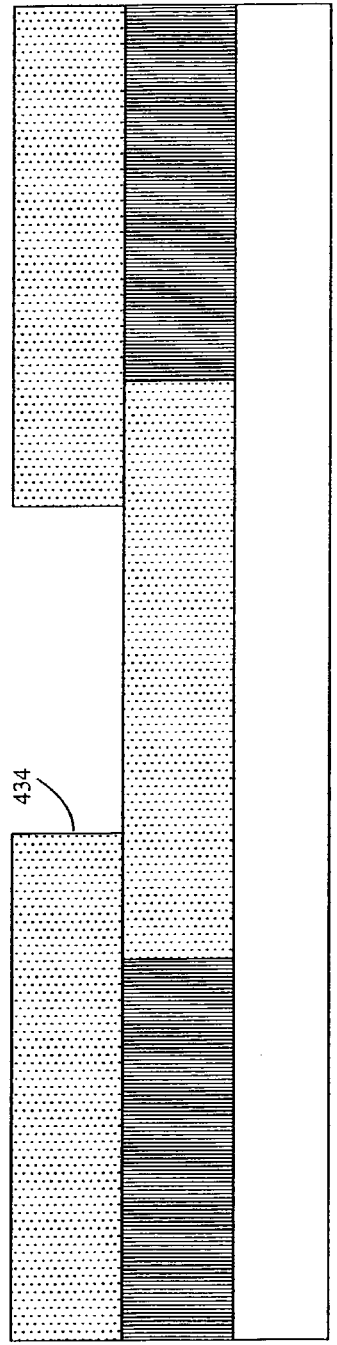
Figure 4C:
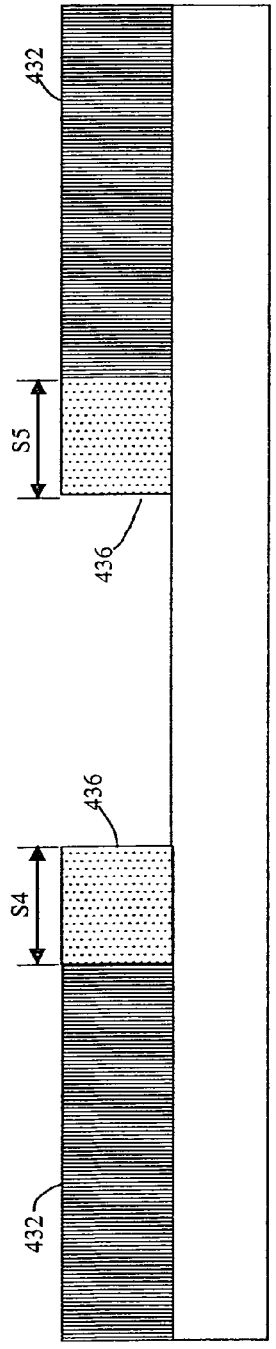

After opening 433 has been formed, preferred methods deposit conformal sacrificial layer 434 of thickness S4 (S5) on sacrificial layer 432 as illustrated in FIGS. 4B–C. The material for sacrificial layer 434 is chosen such that layer 434 may be etched selective to sacrificial mask layer 432.

Then, preferred methods directionally etch the structure of FIG. 4B, resulting in the mask structure illustrated in FIG. 4C, including sacrificial structures 436.

Figure 4D:
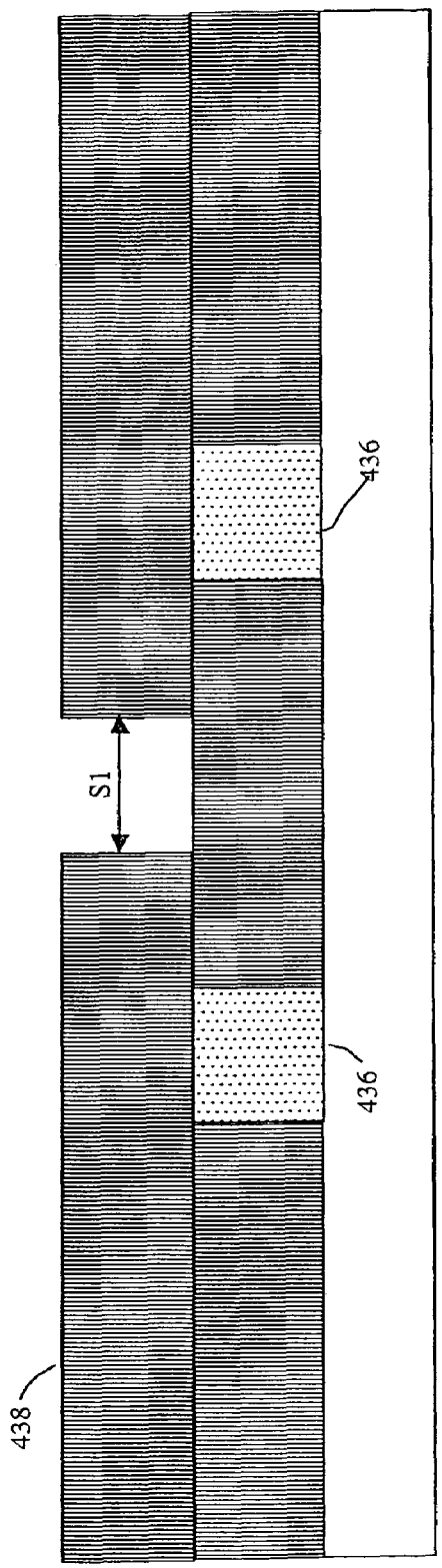

Next, preferred methods deposit sacrificial mask layer 438 of thickness S2 (S3) as illustrated in FIG. 4D. Sacrificial layer 438 may be of the same material as used for sacrificial mask layer 432.

Figure 4E:
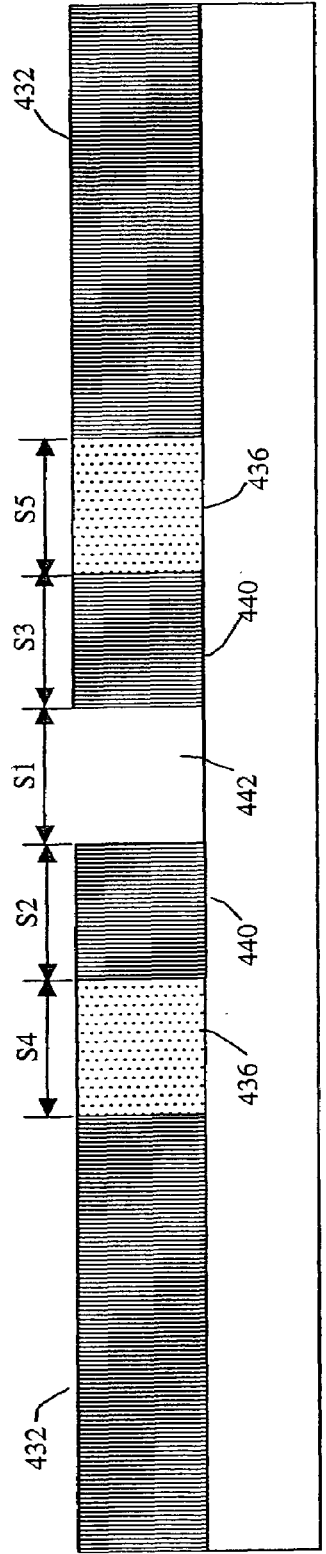

Then, preferred methods directionally etch the structure of FIG. 4D, resulting in the structure illustrated in FIG. 4E. With conjoint reference to FIG. 1C, shapes 436 correspond to dimensions S4 and S5; shapes 440 correspond to dimensions S2 and S3; and shape 442 corresponds to dimension S1.

Figure 4F:
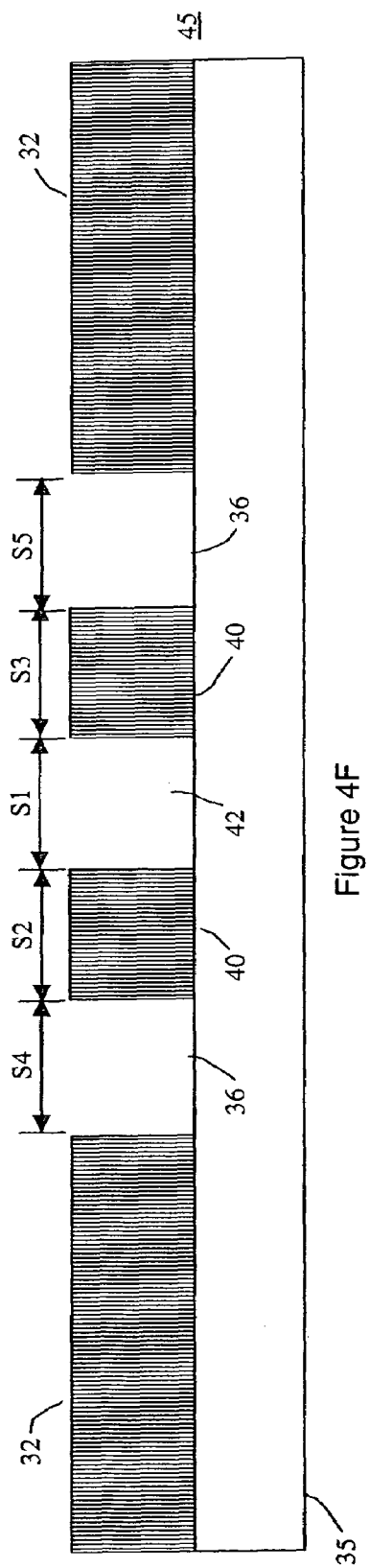
Figure 4G:
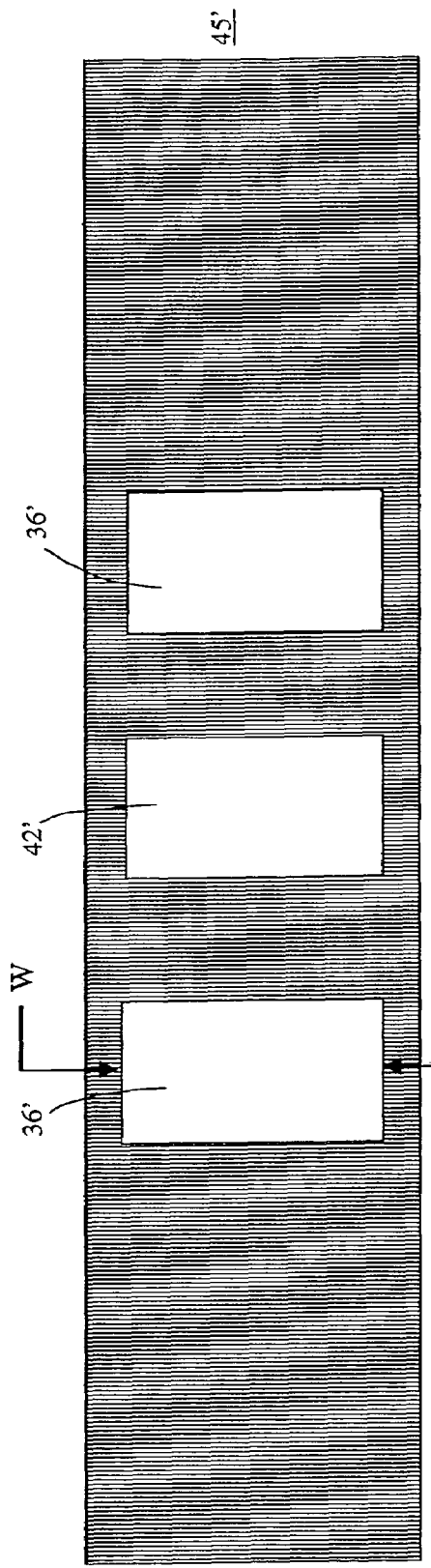

Then, preferred methods remove (etch) sacrificial shapes 436 preferentially to sacrificial layers 432 and 440, resulting in sacrificial mask structure 445 illustrated in cross section in FIG. 4F. The corresponding plan view is illustrated in FIG. 4G. Mask openings 436 and 442 are used to etch substrate 435 at the appropriate method step during the fabrication of the nanotube switching element as described above.

The material used in the fabrication of the electrodes and contacts used in the nanotube switches is dependent upon the specific application, i.e. there is no specific metal necessary for the operation of the present invention.

Nanotubes can be functionalized with planar conjugated hydrocarbons such as pyrenes which may then aid in enhancing the internal adhesion between nanotubes within the ribbons. The surface of the nanotubes can be derivatized to create a more hydrophobic or hydrophilic environment to promote better adhesion of the nanotube fabric to the underlying electrode surface. Specifically, functionalization of a wafer/substrate surface involves "derivitizing" the surface of the substrate. For example, one could chemically convert a hydrophilic to hydrophobic state or provide functional groups such as amines, carboxylic acids, thiols or sulphonates to alter the surface characteristics of the substrate. Functionalization may include the optional primary step of oxidizing or ashing the substrate in oxygen plasma to remove carbon and other impurities from the substrate surface and to provide a uniformly reactive, oxidized surface which is then reacted with a silane. One such polymer that may be used is 3-aminopropyltriethoxysilane (APTS). The substrate surface may be derivitized prior to application of a nanotube fabric.

While single walled carbon nanotubes are preferred, multi-walled carbon nanotubes may be used. Also nanotubes may be used in conjunction with nanowires. Nanowires as mentioned herein is meant to mean single nanowires, aggregates of non-woven nanowires, nanoclusters, nanowires entangled with nanotubes comprising a nanofabric, mattes of nanowires, etc. The invention relates to the generation of nanoscopic conductive elements used for any electronic application.

A FIG. 1 device may be designed to operate as a volatile or non-volatile device. In the case of a volatile device, the mechanical restoring force due to nanotube elongation is stronger than the van der Waals retaining force, and the nanotube mechanical contact with a control or release electrode insulator is broken when the electrical field is removed. Typically, nanotube geometrical factors such as suspended length to gap ratios of less than 5 to 1 are used for volatile devices. In the case of a non-volatile device, the mechanical restoring force due to nanotube elongation is weaker than the van der Waals retaining force, and the nanotube mechanical contact with a control or release electrode insulator remains un-broken when the electric field is removed. Typically, nanotube geometrical factors such as suspended length to gap ratios of greater than 5 to 1 and less than 15 to 1 are used for non-volatile devices. An applied electrical field generating an electromechanical force is required to change the state of the nanotube device. Van der Waals forces between nanotubes and metals and insulators are a function of the material used in the fabrication nanotube switches. By way of example, these include insulators such as silicon dioxide and silicon nitride, metals such as tungsten, aluminum, copper, nickel, palladium, and semiconductors such as silicon. For the same surface area, forces will vary by less than 5% for some combinations of materials, or may exceed 2× for other combinations of materials, so that the volatile and non-volatile operation is determined by geometrical factors such as suspended length and gap dimensions and materials selected. It is, however, possible to design devices by choosing both geometrical size and materials that exhibit stronger or weaker van der Waals forces. By way of example, nanotube suspended length and gap height and fabric layer density, control electrode length, width, and dielectric layer thickness may be varied. Output electrode size and spacing to nanotube may be varied as well. Also, a layer specifically designed to increase van der Waals forces (not shown) may be added during the fabrication nanotube switching element 100 illustrated in FIG. 1. For example, a thin (5 to 10 nm, for example) layer of metal (not electrically connected), semiconductor (not electrically connected), or insulating material may be added (not shown) on the insulator layer associated with control electrode 111 or release electrode 112 that increases the van der Waals retaining force without substantial changes to device structure for better non-volatile operation. In this way, both geometrical sizing and material selection are used to optimize device operation, in this example to optimize non-volatile operation.

The following patent reference refer to various techniques for creating nanotube fabric articles and switches and are assigned to the assignee of this application. Each is hereby incorporated by reference in their entirety.

Nanotube Films and Articles (U.S. Pat. No. 6,706,402, filed Apr. 23, 2002);

Methods of Making Carbon Nanotube Films, Layers, Fabrics, Ribbons, Elements and Articles (U.S. patent application Ser. No. 10/341,005, filed on Jan. 13, 2003);

Electromechanical Memory Having Cell Selection Circuitry Constructed With Nanotube Technology (U.S. Pat. No. 6,643,165, filed Jul. 25, 2001);

Electromechanical Memory Array Using Nanotube Ribbons And Method For Making Same (U.S. patent application Ser. No. 09/915,093, filed on Jul. 25, 2001);

Hybrid Circuit Having Nanotube Electromechanical Memory (U.S. Pat. No. 6,574,130, filed on Jul. 25, 2001);

Methods of Making Electromechanical Three-Trace Junction Devices (U.S. patent application Ser. No. 10/033,032, filed on Dec. 28, 2001);

Electromechanical Three-Trace Junction Devices (U.S. patent application Ser. No. 10/033,323, filed on Dec. 28, 2001);

Methods of Nanotube Films and Articles (U.S. patent application Ser. No. 10/128,117, filed Apr. 23, 2002);

Methods of Using Thin Metal Layers to Make Carbon Nanotube Films, Layers, Fabrics, Ribbons, Elements and Articles (U.S. patent application Ser. No. 10/341,055, filed Jan. 13, 2003);

Methods of Using Pre-formed Nanotubes to Make Carbon Nanotube Films, Layers, Fabrics, Ribbons, Elements and Articles (U.S. patent application Ser. No. 10/341,054, filed Jan. 13, 2003);

Carbon Nanotube Films, Layers, Fabrics, Elements and Articles (U.S. patent application Ser. No. 10/341,130, filed Jan. 13, 2003);

Devices Having Horizontally-Disposed Nanofabric Articles and Methods of Making the Same (U.S. patent application Ser. No. 10/776,059, filed Feb. 11, 2004);

Devices Having Vertically-Disposed Nanofabric Articles and Methods of Making the Same (U.S. patent application Ser. No. 10/776,572, filed Feb. 11, 2004);

As described above, the interconnect wiring used to interconnect the nanotube device terminals may be conventional wiring such as AlCu, W, or Cu wiring with appropriate insulating layers such as SiO2, polyimide, etc. The interconnect may also be single- or multi-wall nanotubes used for wiring.

A nanofabric or ribbon has been shown to substantially conform to a surface, such as a surface of an article on a semiconductor substrate. A fabric of nanotubes may be constructed by any appropriate means, including, but not limited to spin coating, direct growth on a suitable substrate or other application. The fabric will be horizontally oriented when the surface of the substrate that receives the fabric is horizontally oriented. The present inventors have appreciated that devices such as electromechanical switches can be constructed using nanofabrics which have conformed to a surface which is substantially perpendicular to a semiconductor substrate (vertically-oriented) and that such devices can be used as vertically oriented switches in a plethora of applications. Fabrication techniques to develop such horizontally- and vertically-disposed fabrics and devices composed of nanotube fabrics which comprise redundant conducting nanotubes may be created via CVD, or by room temperature operations as described herein and described in the patent references incorporated herein. Such fabrication techniques include the ability to form said switches for use in many different articles having relatively short spans of suspended nanofabric articles. In some embodiments, this allows smaller device dimensions and higher strains in the nanofabric articles, as well as lower electrical resistances. Such articles may be adapted or modified to perform logic functions or be part of a scheme involving logical functionality. Such articles may be adapted to form memory functions or be part of a scheme involving memory functionality.

Volatile and non-volatile switches, and switching elements of numerous types of devices, can be thus created. In certain preferred embodiments, the articles include substantially a monolayer of carbon nanotubes. In certain embodiments the nanotubes are preferred to be single-walled carbon nanotubes. Such nanotubes can be tuned to have a resistance between 0.2–100 kOhm/□ or in some cases from 100 kOhm/□ to 1 GOhm/□.

It should be noted that the critical surfaces of the devices of the present invention do not require Chemo-Mechanical Polishing (CMP) unlike the critical surfaces of many similar prior art devices.

The device structure and fabrication methods described herein are applicable to a wide range of dimensions and operating voltages. The fabrication method includes fabrication of masks for exposing small device geometries, as well as fabrication methods for the nanotube device (switch). For illustrative purposes, a 130 nm photoresist capability is assumed, however the inventors envision the use of this invention with other lithography paradigms. The switching length $L_{NT}$ is designed to be 325 nm. The switching width $W_{NT}$ is designed to ensure that a sufficient number of conductive carbon nanotubes span the length of the switching length $L_{NT}$ to achieve a desired resistance value. $W_{NT}$ may be 325 nm, for example.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A method of forming a nanotube switching element, comprising:

forming a first structure having at least one output electrode;

forming a nanotube layer and lithographically defining a shape of a conductive article by lithographically patterning the layer and removing portions of the layer to form a conductive article having at least one nanotube; wherein the at least one nanotube is substantially parallel to a substrate having the nanotube switching element forming a second structure having at least one output electrode and positioning said second structure in relation to the first structure and the conductive article such that the output electrode of the first structure is opposite the output electrode of the second structure and such that a portion of the conductive article is positioned therebetween;

providing at least one signal electrode in electrical communication with the conductive article having at least one nanotube;

providing at least one control electrode in relation to the conductive article such that the control electrode may control the conductive article to form a channel between the signal electrode and at least one of the output electrodes.

2. The method of claim 1 further comprising providing a second control electrode in relation to the conductive article such that the second control electrode may control the conductive article to unform a channel between the signal electrode and at least one of the output electrodes, wherein the control electrode and the second control electrode are formed to be on opposite sides of the conductive article.

3. The method of claim 2 wherein the formation of the first and second structures creates a switching region cavity in which the conductive article is at least partially suspended such that it is electrostatically deflectable in response to electrical activation of at least one of the control electrode and the second control electrode.

4. The method of claim 1 wherein the first and second structures each include a respective second output electrode and wherein the second output electrodes are positioned opposite each other with the conductive article positioned therebetween.

5. The method of claim 1 wherein the output electrode of the first structure and the output electrode of the second structure are tied together.

6. The method of claim 4 wherein the second output electrode of the first structure and the second output electrode of the second structure are tied together.

7. The method of claim 2 wherein the control electrode and the second control electrode each include an insulator layer on a surface facing the conductive article.

8. The method of claim 1 wherein the output electrode of one of the first and second structures includes an insulator layer on a surface facing the conductive article.

9. The method of claim 4 wherein the output electrode of one of the first and second structures includes an insulator layer on a surface facing the conductive article and wherein the second output electrode of the one of the first and second structures includes an insulator layer on a surface facing the conductive article.

10. The method of claim 2 wherein a surface of the nanotube switching element includes an area defining the control electrode and wherein the area includes at least one dimension that is sub-lithographic.

11. The method of claim 4 wherein a surface of the nanotube switching element includes area defining an output electrode and an area defining a second output electrode and wherein the areas each include at least one dimension that is sub-lithographic.

12. The method of claim 3 wherein the control electrode is formed to have a first spaced relation relative to the conductive article, and wherein the second control electrode is formed to have a second spaced relation relative to the conductive article and wherein the first and second spaced relations have different magnitudes.

13. The method of claim 4 wherein the output electrode and the second output electrode of the first structure are positioned symmetrically about a control electrode, and wherein the output electrode and the second output electrode of the second structure are positioned symmetrically about a control electrode.

14. A method of forming a nanotube switching element, comprising:

forming a first structure having a first output electrode and a first control electrode;

forming a conductive article having at least one nanotube;

providing at least one signal electrode in electrical communication with the conductive article;

forming a second structure having a second output electrode and a second control electrode and positioning said second structure in relation to the first structure and the conductive article so as to clamp the conductive article between the first and second structures to suspend a central portion of the conductive article between the first and second structures, such that first output electrode is opposite the second output electrode and the first control electrode is opposite the second control electrode, such that at least one of the first and second control electrodes may control the central portion of the conductive article to form a channel between the signal electrode and one of the first and second output electrodes.

* * * * *